(12) United States Patent
Hosono et al.

(10) Patent No.: US 7,936,586 B2
(45) Date of Patent: May 3, 2011

(54) NONVOLATILE SEMICONDUCTOR STORAGE APPARATUS AND DATA PROGRAMMING METHOD THEREOF

(75) Inventors: Koji Hosono, Fujisawa (JP); Hiroshi Maejima, Chigasaki (JP); Yuri Terada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 12/544,276

(22) Filed: Aug. 20, 2009

(65) Prior Publication Data

US 2010/0046275 A1    Feb. 25, 2010

(30) Foreign Application Priority Data

Aug. 25, 2008 (JP) ................................ 2008-215493
Feb. 19, 2009 (JP) ................................ 2009-036472

(51) Int. Cl.
   *G11C 11/00* (2006.01)
(52) U.S. Cl. ............................ 365/148; 365/175; 365/51
(58) Field of Classification Search .................. 365/148, 365/175, 51, 163, 185.18
See application file for complete search history.

(56) References Cited

U.S. PATENT DOCUMENTS

| 6,005,802 | A | 12/1999 | Takeuchi et al. |
| 6,141,241 | A | 10/2000 | Ovshinsky et al. |
| 7,755,922 | B2 * | 7/2010 | Taguchi ........................ 365/148 |
| 2008/0049511 | A1 | 2/2008 | Crippa et al. |

OTHER PUBLICATIONS

U.S. Appl. No. 12/876,746, filed Sep. 7, 2010.

* cited by examiner

*Primary Examiner* — David Lam
(74) *Attorney, Agent, or Firm* — Oblon, Spivak, McClelland, Maier & Neustadt, L.L.P.

(57) ABSTRACT

The semiconductor storage apparatus includes a memory cell array including memory cells each having a rectifying element and a variable resistive element connected in series, the memory cells being arranged in crossing portions of a plurality of first wires and a plurality of second wires, and a control circuit configured to control charging to the first wire. The control circuit charges the first wire connected to a selected memory cell up to a first potential, and then set the first wire in a floating state. Then it charges another first wire adjacent to the first wire connected to the selected memory cell to a second potential. The potential of the first wire connected to the selected memory cell is thereby caused to rise to a third potential by coupling.

20 Claims, 29 Drawing Sheets

NONVOLATILE SEMICONDUCTOR STORAGE APPARATUS AND DATA PROGRAMMING METHOD THEREOF

CROSS REFERENCE TO RELATED APPLICATIONS

This application is based on and claims the benefit of priority from prior Japanese Patent Application No. 2008-215493, filed on Aug. 25, 2008, and prior Japanese Patent Application No. 2009-36472, filed on Feb. 19, 2009, the entire contents of which are incorporated herein by reference.

BACKGROUND OF THE INVENTION

1. Field of the Invention

The present invention relates to a semiconductor storage apparatus and a data programming method thereof.

2. Description of the Related Art

In recent years, a resistance change memory has attracted attention as a candidate to succeed the flash memory. Here, the resistance change memory includes, in addition to a resistance change memory (ReRAM: Resistive RAM) in a narrow sense in which transition-metal oxide is used as a recording layer and a resistance state thereof is stored in a nonvolatile manner, a phase change memory (PCRAM: Phase Change RAM) in which chalcogenide or the like is used as a recording layer and resistance information of a crystalline state (conductor) and an amorphous state (insulator) thereof is used.

It is known that a variable resistive element of a resistance change memory has two operation modes: one operation mode is called a bipolar type in which a high-resistance state and a low-resistance state are set by switching polarity of an applied voltage; and the other operation mode is called a unipolar type in which a high-resistance state and a low-resistance state are made to be settable by controlling the voltage value and voltage application time without switching polarity of the applied voltage.

The unipolar type is desirable to achieve a high-density memory cell array. This is because when the unipolar type is adopted, a cell array can be formed by piling up a variable resistive element and a rectifying element such as a diode at a crossing portion of a bit line and a word line, without using a transistor. Further, by arranging and laminating such memory cell arrays three-dimensionally, a large capacity can be achieved without increasing a cell array area (see Japanese Patent Application Laid-Open No. 2002-541613).

In order to achieve a cost-effective memory chip by increasing the integration degree of a memory cell array, it is necessary to reduce the number of divisions of the memory cell array and laminate as many cell arrays as possible in a vertical direction. In that case, however, the distance between peripheral circuits and memory cell arrays increases and a wire between bit lines and peripheral circuits may have a large parasitic capacitance. Such a large parasitic capacitance could cause an erroneous write or an erroneous erase operation in memory cells.

SUMMARY OF THE INVENTION

In accordance with an aspect of the present invention, a semiconductor storage apparatus includes: a memory cell array including memory cells each having a rectifying element and a variable resistive element connected in series, the memory cells being arranged in crossing portions of a plurality of first wires and a plurality of second wires; and a control circuit configured to control charging to the first wire, the control circuit being configured to sequentially perform a first step to charge the first wire connected to a selected memory cell up to a first potential and then set the first wire in floating state, and then a second step to charge another first wire adjacent to the first wire connected to the selected memory cell up to a second potential, thereby causing the potential of the first wire connected to the selected memory cell to rise up to a third potential by coupling, data program of the selected memory cell being performed by the third potential.

In accordance with another aspect of the present invention, a semiconductor storage apparatus includes: a memory cell array including a memory cells each having rectifying element and a variable resistive element connected in series, the memory cells being arranged in crossing portions of a plurality of first wires and a plurality of second wires; a selection transistor connected to the first wire and having a gate supplied with a selection signal; and a control circuit configured to control charging to the first wire by controlling the selection transistor, the control circuit being configured to control the selection signal to be supplied to the selection transistor that is connected to the first wire connected to the selected memory cell to charge the first wire to a first potential and then set the first wire in a floating state by lowering a magnitude of the selection signal.

In accordance with an aspect of the present invention, a data programming method of a semiconductor storage apparatus having a memory cell array including memory cells each having a rectifying element and a variable resistive element connected in series, the memory cells being arranged in crossing portions of a plurality of first wires and a plurality of second wires, the method comprising: after charging the first wire connected to the selected memory cell up to a first potential, setting the first wire connected to the selected memory cell in a floating state; charging another first wire adjacent to the first wire connected to the selected memory cell up to a second potential, thereby causing the potential of the first wire connected to the selected memory cell to rise up to a third potential by coupling; and performing data program of the selected memory cell by the third potential.

DETAILED DESCRIPTION OF THE EMBODIMENTS

Embodiments of the present invention will be described below with reference to attached drawings. In these embodiments, the semiconductor storage apparatus is assumed to be a resistance change memory having a three-dimensional memory cell array structure in which memory cell arrays are laminated. However, this structure is only an example and it is needless to say that the present invention is not limited to this structure.

First Embodiment

Figure 1:
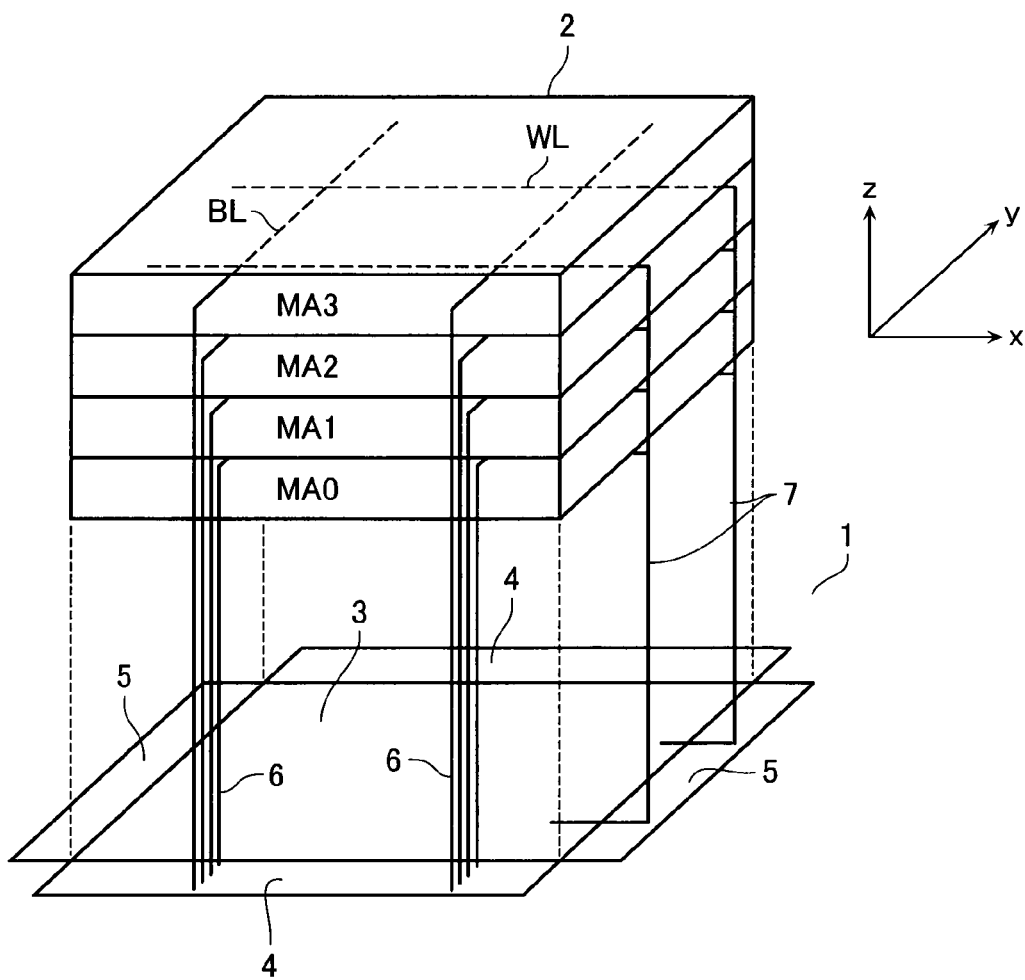
FIG. 1 is a perspective view showing a configuration of a resistance change memory in an embodiment of the present invention.

FIG. 1 shows the basic structure of a resistance change memory according to the first embodiment of the present invention, that is, the configuration of a wiring area 3 in which wires such as a global bus on a semiconductor substrate 1 are formed and a memory block 2 laminated thereon. As shown in FIG. 1, the memory block 2 has, for example, four layers of memory cell arrays MA0 to MA3. The wiring area 3 is provided in the semiconductor substrate 1 immediately below the memory block 2. In the wiring area 3, a global bus or the like is provided for exchanging data to be written or read from the memory block 2 with outside sources. Also in the wiring area 3, a column control circuit including a column switch described later or a row control circuit including a row decoder may be provided.

A vertical wire (via contact) is needed on the side of the memory block 2 in order to connect word lines WL and bit lines BL of each laminated memory cell array MA to the wiring area 3 formed on the semiconductor substrate 1. Bit line contact areas 4 and word line contact areas 5 are provided along four edges of the wiring area 3. Bit line contacts 6 and word line contacts 7 to connect the bit lines BL and word lines WL to a control circuit are formed in the bit line contact areas 4 and the word line contact areas 5 respectively. The word line WL has one end connected to the wiring area 3 via the word line contact 7 formed in the word line contact area 5. The bit line BL has one end connected to the wiring area 3 via the bit line contact 6 formed in the bit line contact area 4. Although FIG. 1 shows one memory block 2 obtained by laminating a plurality of memory cell arrays MA in a direction perpendicular to the semiconductor substrate 1 (z direction shown in FIG. 1), an actual structure includes a plurality of the above-mentioned memory blocks 2 arranged in a matrix form in the longitudinal direction (x direction shown in FIG. 1) of the word line WL and in the longitudinal direction (y direction shown in FIG. 1) of the bit line BL.

In the present embodiment, as shown in FIG. 1, there is only one column of contacts in the word line contact area 5, i.e., the word lines WL of all layers in one cross section are connected to the wiring area 3 via common contacts. In the bit line contact area 4, the bit lines BL of each layer are connected to the wiring area 3 via four columns of contacts prepared individually for each layer. In the present embodiment, although the bit lines BL are driven independently in each layer and the word lines WL in all layers are connected in common, the word lines WL may also be driven independently in each layer. Alternatively, the bit lines BL may be connected in common and the word lines WL may be driven independently. Further, at least one of the bit lines BL and the word lines WL may be shared by upper and lower layers.

Figure 2:
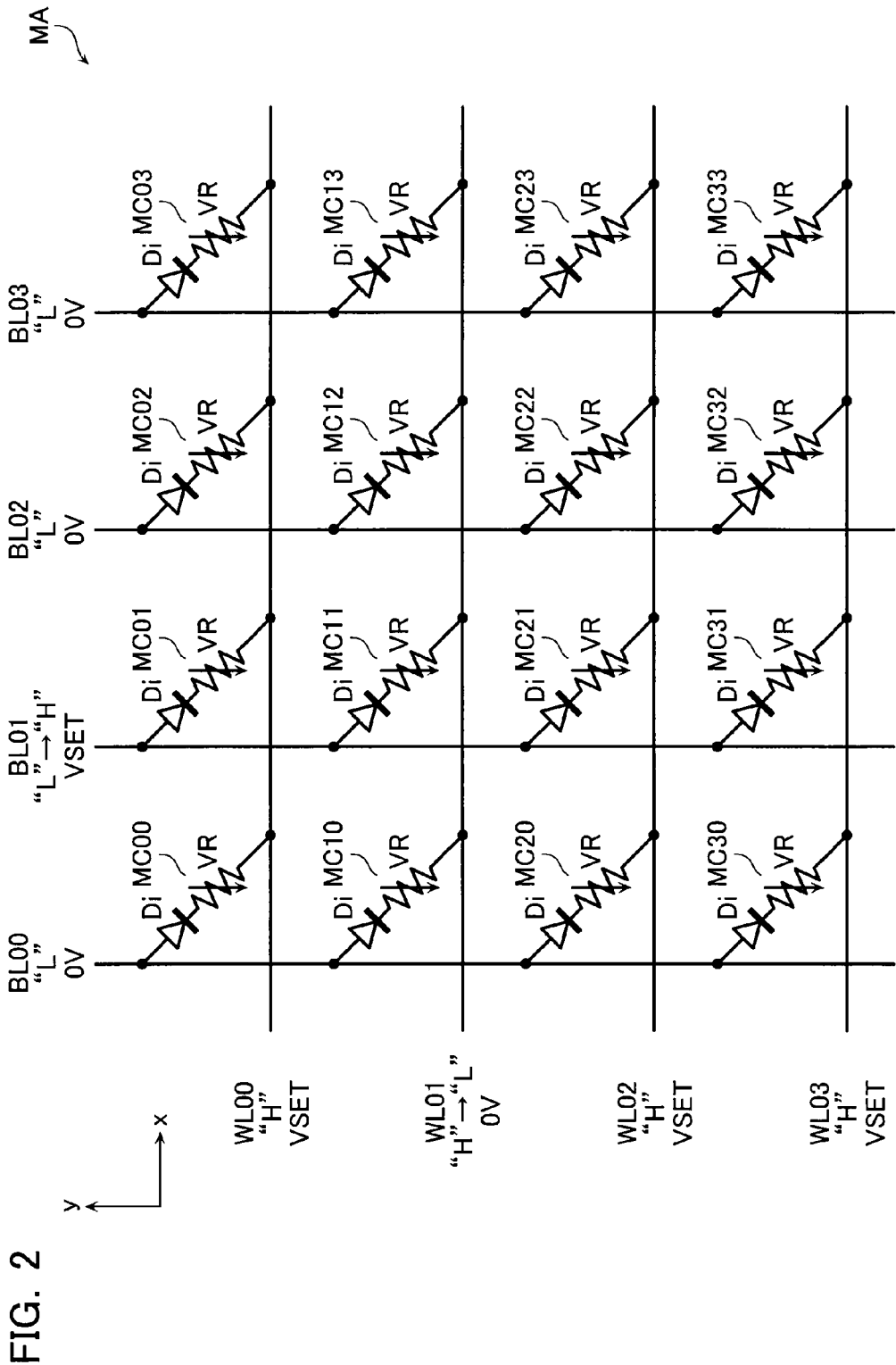
FIG. 2 is a circuit diagram showing an equivalent circuit to a memory cell array of the resistance change memory in the embodiment of the present invention.

FIG. 2 is a circuit diagram showing an equivalent circuit of the memory cell array MA of the resistance change memory. Here, the memory cell array MA shown in FIG. 2 has a plurality of memory cells MC arranged in the longitudinal direction (x direction shown in FIG. 2) of the word line WL as well as in the longitudinal direction (y direction shown in FIG. 2) of the bit line BL, thereby forming a two-dimensional matrix array.

As shown in FIG. 2, memory cells MC of resistance change type each having a rectifying element such as a diode Di and a variable resistive element VR connected in series are arranged in crossing portions of the word lines WL and the bit lines BL. Here, the arrangement of the diode Di and the variable resistive element VR included in the memory cell MC, and polarity of the diode Di are not limited to those illustrated in FIG. 2.

The variable resistive element VR has a structure of, for example, an electrode/transition-metal oxide/electrode. A resistance change of the metal oxide is caused by application of a certain voltage, current, heat and the like, and states of different resistance are stored as information in a nonvolatile manner. More specifically, as a substance for forming the variable resistive element VR, the following substances may be used: a substance such as chalcogenide with variable resistance caused by a phase transition between a crystalline state and an amorphous state (PCRAM); a substance with variable resistance caused by conductive-bridge formation between electrodes due to deposition of metallic cations or destruction of the conductive bridge by ionizing the deposited metal (CBRAM: Conductive Bridging RAM); and a substance with variable resistance caused by application of a voltage or a current (ReRAM) (roughly, a resistance change is caused by presence/absence of charges trapped by a charge trap present in an electrode interface or by presence/absence of a conductive path resulting from oxygen deficiency or the like).

In ReRAM of the unipolar type, data is written into the memory cell MC by applying a voltage of, for example, 3.5 V (actually about 4.5 V if the voltage drop of the diode Di is taken into consideration) and a current of about 10 nA to the variable resistive element VR for 10 ns to 100 ns. Accordingly, the variable resistive element VR changes from the high-resistance state to the low-resistance state. Hereinafter, an operation to change the variable resistive element VR from the high-resistance state to the low-resistance state will be called a set operation.

On the other hand, data is erased from the memory cell MC by applying a voltage of 0.8 V (actually about 1.8 V if the voltage drop of the diode Di is taken into consideration) and a current of about 1 µA to 10 µA to the variable resistive element VR in the low-resistance state after a set operation for 500 ns to 2 µs. Accordingly, the variable resistive element VR changes from the low-resistance state to the high-resistance state. Hereinafter, an operation to change the variable resistive element VR from the low-resistance state to the high-resistance state will be called a reset operation.

As an example, a high-resistance state of the memory cell MC is defined as a stable state (a reset state). In order to store binary data, data write is achieved by a set operation to change the reset state to the low-resistance state.

A read operation of the memory cell MC is performed by applying the voltage of 0.4 V (actually about 1.4 V if the voltage drop of the diode Di is taken into consideration) to the variable resistive element VR and monitoring a current passing through the variable resistive element VR using a sense amplifier. Accordingly, whether the variable resistive element VR is in the low-resistance state or the high-resistance state is determined. If one memory cell MC can hold 2-bit data, three different reference voltages are generated by the sense amplifier and these reference voltages and a cell signal are compared by the sense amplifier.

The set operation of the resistance change memory according to the present embodiment will be described with reference to FIG. 2. FIG. 2 shows states of the voltages applied to the bit lines BL and the word lines WL connected to the memory cell array MA during set operation of the memory cell MC. Here, it is assumed that the selected memory cell MC into which data is written by the set operation is MC11.

Unselected bit lines BL00, BL02, and BL03 that are not connected to the selected memory cell MC11 are in an "L" state (Vss=0 V in the present embodiment). The selected bit line BL01 connected to the selected memory cell MC11 is driven from the "L" state (Vss=0 V) to an "H" state (a voltage VSET in the present embodiment) during set operation. Unselected word lines WL00, WL02, and WL03 that are not connected to the selected memory cell MC11 are in the "H" state (the voltage VSET in the present embodiment). The selected word line WL01 connected to the selected memory cell MC11 is driven from the "H" state (the voltage VSET) to the "L" state (Vss=0 V in the present embodiment) during set operation. Accordingly, the diode Di of the selected memory cell MC11 is biased in the forward direction, causing a current to flow. The potential difference VSET is applied to the selected memory cell MC11 to change the variable resistive element VR from the high-resistance state to the low-resistance state, completing the set operation.

Figure 3:
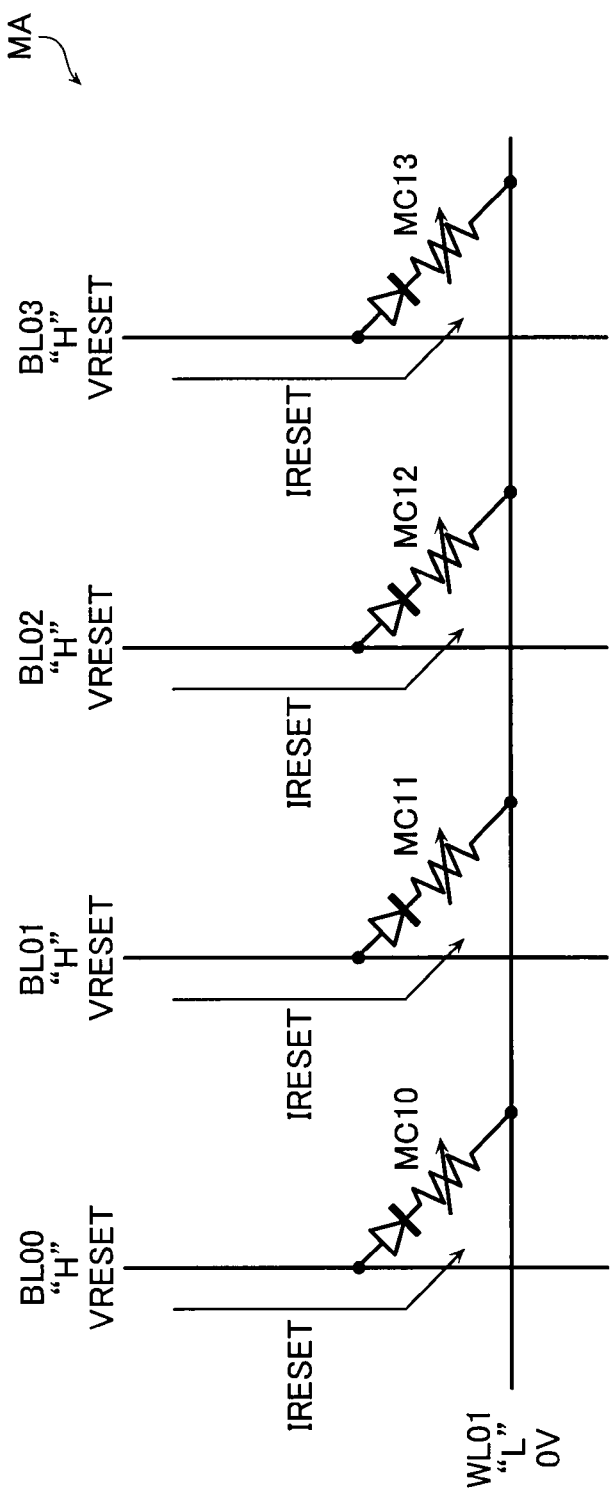
FIG. 3 is a conceptual diagram illustrating a reset operation of the resistance change memory.

Next, the reset operation of the resistance change memory will be described with reference to FIG. 3.

The selected bit lines BL00 to BL03 connected to the selected memory cells MC10 to MC13 are driven to the "H" state (the voltage VRESET in the present embodiment) during reset operation. Also, the selected word line WL01 connected to the selected memory cells MC10 to MC13 are driven to the "L" state (the voltage Vss=0 V in the present embodiment) during reset operation. Here, unselected word lines WL00, WL02, and WL03 not connected to the selected memory cells MC10 to MC13 are in the "H" state (for example, the voltage VRESET). The reset voltage VRESET applied to the bit lines BL00 to BL03 is a standard voltage capable of changing the variable resistive element VR of the memory cell MC from the low-resistance state to the high-resistance state.

With voltage application to the selected bit lines BL00 to BL03, the diode Di of the selected memory cells MC10 to MC03 is biased in the forward direction, causing a current to flow. A reset current IRESET capable of performing a reset operation is caused to flow through each memory cell MC. With the reset voltage VRESET applied to the bit lines BL00 to BL03 and the reset current IRESET, the variable resistive element VR changes from the low-resistance state to the high-resistance state, completing the reset operation.

Here, the voltage and current generated in the memory cell MC during set operation, reset operation and read operation will be described with reference to FIGS. 27, 28, 29, and 30.

Figure 27:
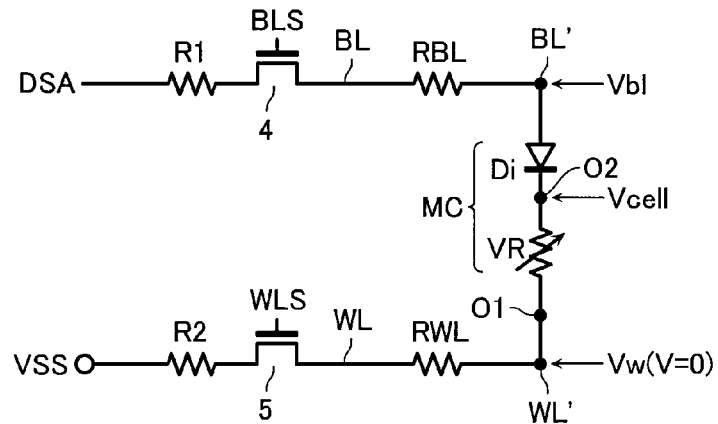
FIG. 27 illustrates the voltage and current generated in a memory cell MC in the set operation, reset operation, and read operation.

FIG. 27 is a simplified diagram of a current path of one memory cell MC arranged in a crossing portion of one bit line BL and one word line WL. One end of the bit line BL is connected to a bit line selection transistor 4 and one end of the word line WL is connected to a word line selection transistor 5. Besides, RBL and RWL in FIG. 27 are parasitic resistances of the bit line BL and the word line WL respectively. The other end of the bit line selection transistor 4 is connected to a control line DSA connected to a data control circuit (not shown) via a parasitic resistor R1. The other end of the word bit line selection transistor 5 is connected to a ground terminal VSS via a parasitic resistor R2 and an ON resistor of a grounding transistor (not shown).

Figure 28:
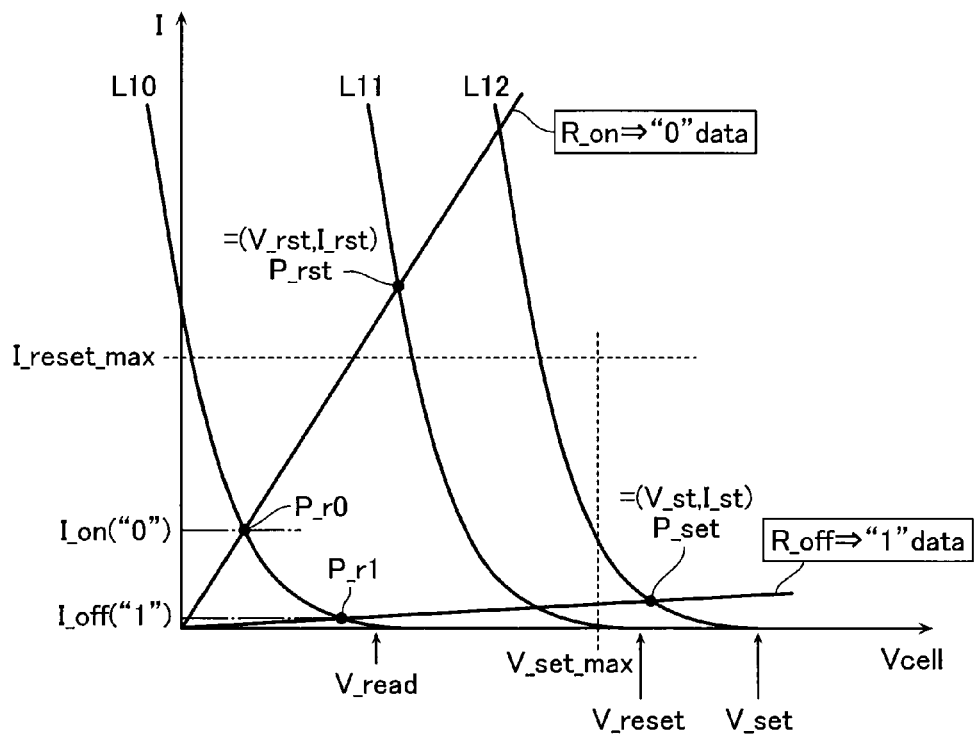
FIG. 28 illustrates the voltage and current generated in the memory cell MC in the set operation, reset operation, and read operation.

FIG. 28 shows an operating point analysis diagram of the set, reset, and read operations. In FIG. 28, a potential Vw of a node O1 at one end of the memory cell MC is defined as a reference voltage (Vw=0 V). Moreover, a potential of a node O2 between the variable resistive element VR and the diode Di is defined as Vcell. In addition, a potential of a node O3 on an anode side of the diode Di is defined as Vbl. The horizontal axis of the graph in FIG. 28 indicates Vcell and the vertical axis thereof indicates a current Icell.

First, a current that flows through the memory cell MC when the potential Vbl of the node O3 is set at a value of V_set in the set operation is plotted in FIG. 28. In this case, the operating point becomes P_set. This operating point P_set is for changing a memory cell in a high-resistance state R_off ("1" data) to a low-resistance state R_on ("0" data). This operation point P_set is the one before the set operation is completed. It is necessary that the operating point P_set should be set at a point that exceeds a voltage V_set_max that can "set" all memory cells MC.

Next, if the potential Vbl of the node O3 is set at a value of V_reset in the reset operation, the operating point becomes the point P_rst shown in FIG. 28. The operating point P_rst is an operating point to change a memory cell in the low-resistance state R_on ("0" data) to the high-resistance state R_off ("1" data). It is necessary that the operating point P_rst should be set at a point that exceeds a current (I_reset_max) that can "reset" all memory cells MC.

In the read operation, if Vbl=V_read, the operating point becomes P_r0 or p_r1. Therefore, whether data is "0" or "1" can be determined by a determination of current Ith that distinguishes the cell currents I_on ("0" cell) or I_off ("1" cell) that is caused to flow at this point.

Next, problems of each of the reset operation and set operation will be described with reference to FIGS. 28 and 29.

Figure 29:
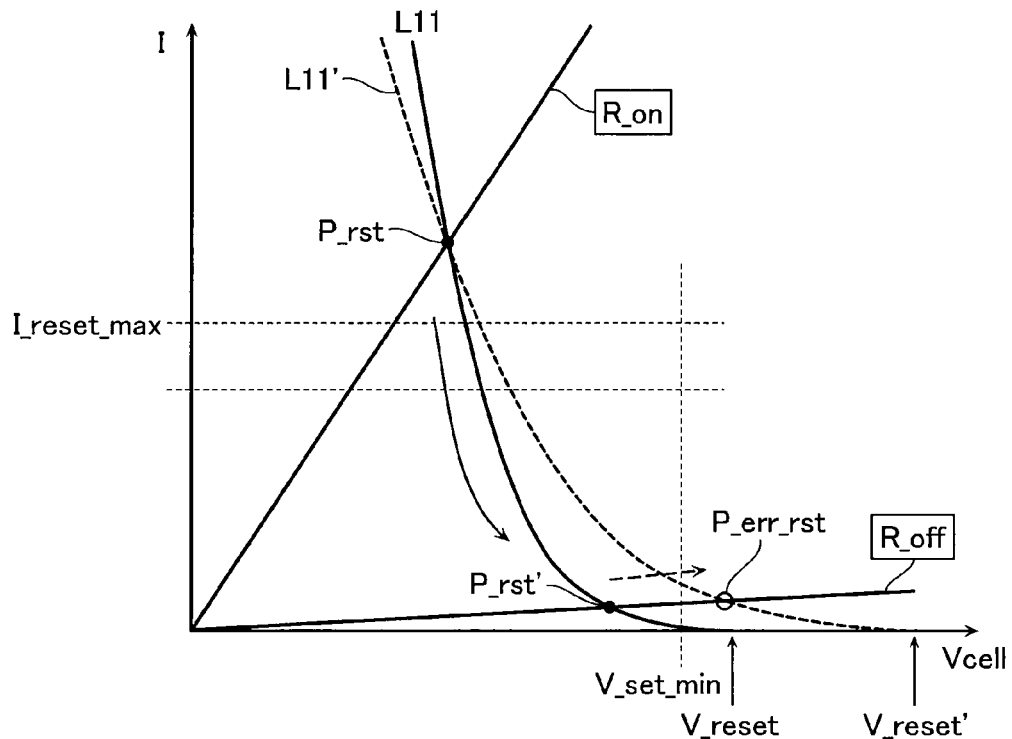
FIG. 29 illustrates the voltage and current generated in the memory cell MC in the set operation, reset operation, and read operation.

FIG. 29 shows operating points before and after a reset operation is completed in the reset operation. In the reset operation, the operating point moves from a point P_rst in the low-resistance state (before reset completion) to a point p_rst' after changing to the high-resistance state (after reset completion). To perform a reset operation here, it is necessary to set an operating point beyond the current I_reset_max needed for the reset operation, thereby applying the voltage V_reset to the bit line BL.

In this case, if a parasitic resistance of the whole current path through which a reset current flows is high, characteristics of the current flowing through the diode Di change from a curve L11 to a curve L11'. Accordingly, it becomes necessary to actually provide a voltage V_reset' higher than V_reset as the maximum potential difference of the current path. Then, the operating point after the reset operation is completed becomes P_err_rst.

Since the operating point P_err_rst exceeds the voltage V_set_min for the set operation of a memory cell, there is a possibility that the memory cell MC is erroneously set (erroneous set) again immediately after the reset operation is completed. To prevent such a situation, the following methods are effective for avoiding the erroneous set. Specifically, for example, the parasitic resistance may be as small as possible to suppress the rise of the operating point after the reset operation is completed. In addition, widening a margin by performing a reset operation equipped with a bit-per-verify function is also effective. Moreover, lowering a voltage V_reset applied to the bit line immediately after the reset operation is also effective to avoid erroneous set.

Figure 30:
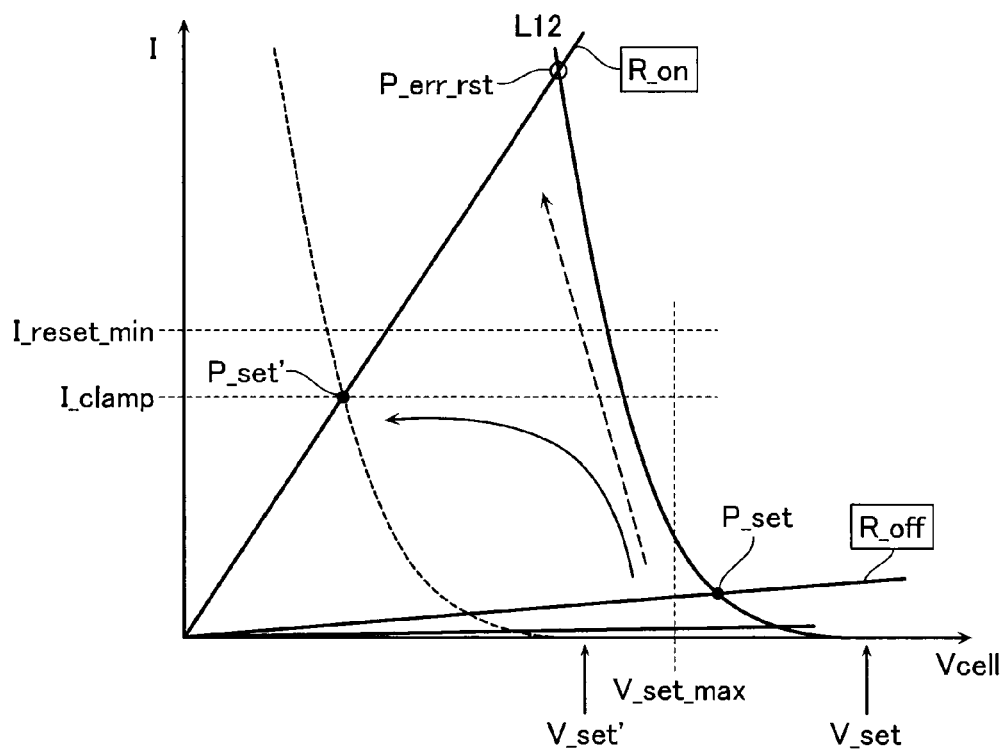
FIG. 30 illustrates the voltage and current generated in the memory cell MC in the set operation, reset operation, and read operation.

Next, FIG. 30 shows operating points before and after a set operation is completed in the set operation. When the variable resistive element VR of the memory cell MC is in the high-resistance state, the operating point is at the position of P_set. Then, after the set operation is completed to change the variable resistive element VR from the high-resistance state to the low-resistance state, a current flowing to the memory cell MC is controlled so that the operating point is changed to the point P_set', instead of the point P_err_rst. This is because the operating point P_err_rst is beyond the current I_reset_min and thus, if an operation at this operating point is continued, there is a possibility that the memory cell MC is reset (erroneously reset) again immediately after the set operation is completed.

Figure 31:
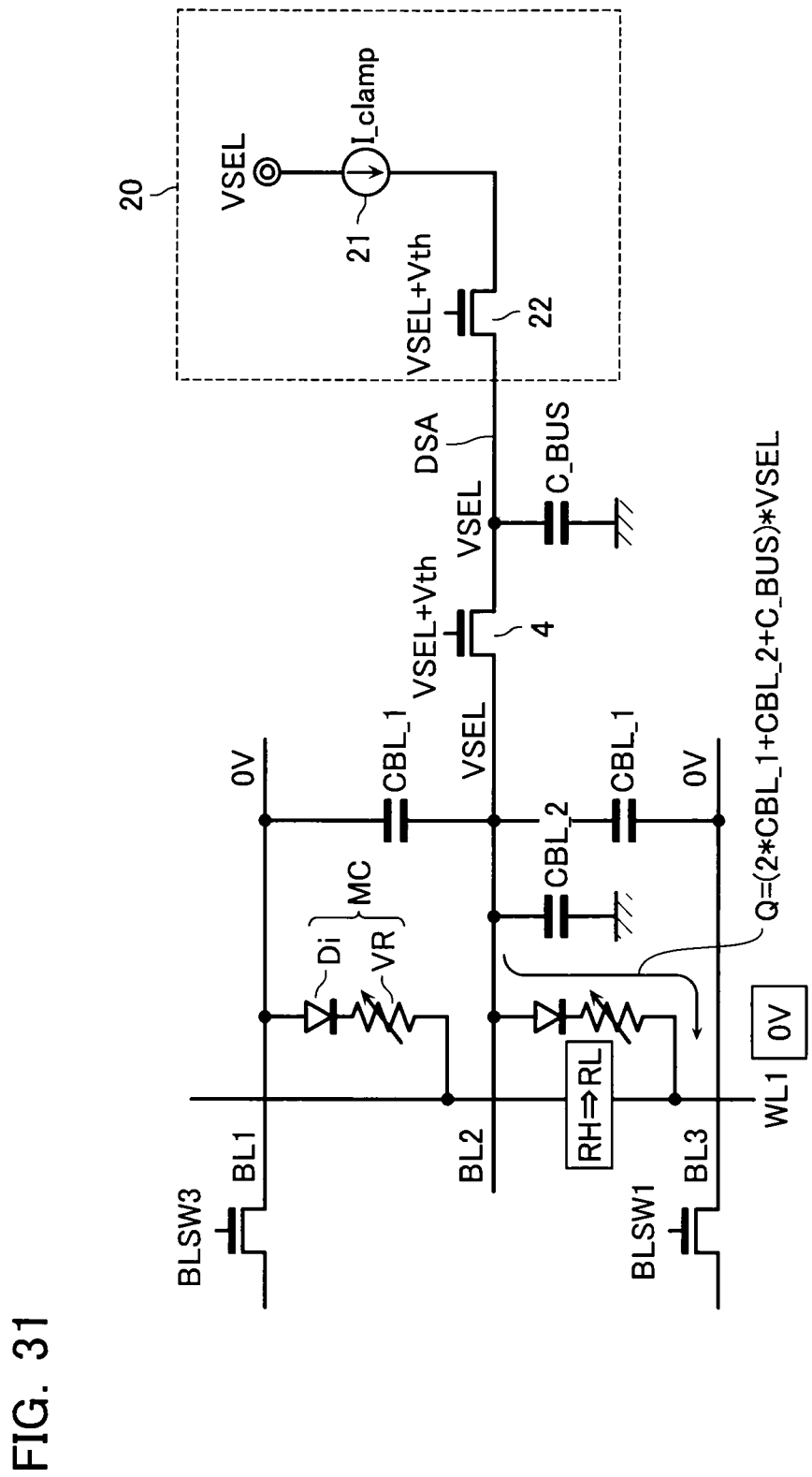
FIG. 31 shows an example of a circuit to prevent an erroneous reset operation.

Thus, as shown in FIG. 31, a current clamp circuit is inserted into a current path of the data control circuit 20 that supplies the voltage V_set to prevent a current equal to or larger than the current I_clamp from flowing to the memory cell MC so that such an erroneous reset should not occur.

In FIG. 31, the bit lines BL are connected to a node DSA via the bit line selection transistor 4 and a predetermined voltage is provided to the node DSA by the data control circuit 20.

Here, the node DSA has a parasitic capacitance C_BUS between the data control circuit 20 and the bit line selection transistor 4. The value of the parasitic capacitance C_BUS has a magnitude that cannot be ignored with an increasing size of the memory cell array and may be larger than a parasitic capacitance C_BL (=2*C_BL1+C_BL2) of the bit lines BL.

The data control circuit 20 in FIG. 31 includes a constant current source circuit 21 and a switching transistor 22. The constant current source circuit 21 has one end supplied with a set voltage VESL, and can be set a desired current accordingly. It is assumed here that the data control circuit 20 is used to perform a set operation for the memory cell MC so that the variable resistive element VR of the memory cell MC is changed from a high-resistance state RH to a low-resistance state RL.

When the variable resistive element VR changes to the low-resistance state RL, it is expected that the current flowing through the selected bit line BL2 and the node DSA is limited to the current Iclamp by the constant current source circuit 21. But actually charges are accumulated in the parasitic capacitance C_BUS of a bit line capacitance C_BL and the node DSA, then the charges flow into the selected memory cell MC before the current is limited by the constant current source circuit 21. Thus, in the present embodiment, as will be described below in detail, the risk of an erroneous reset during set operation is decreased by reducing a current flowing into the memory cell before current limitations by the constant current source circuit start.

Figure 4:
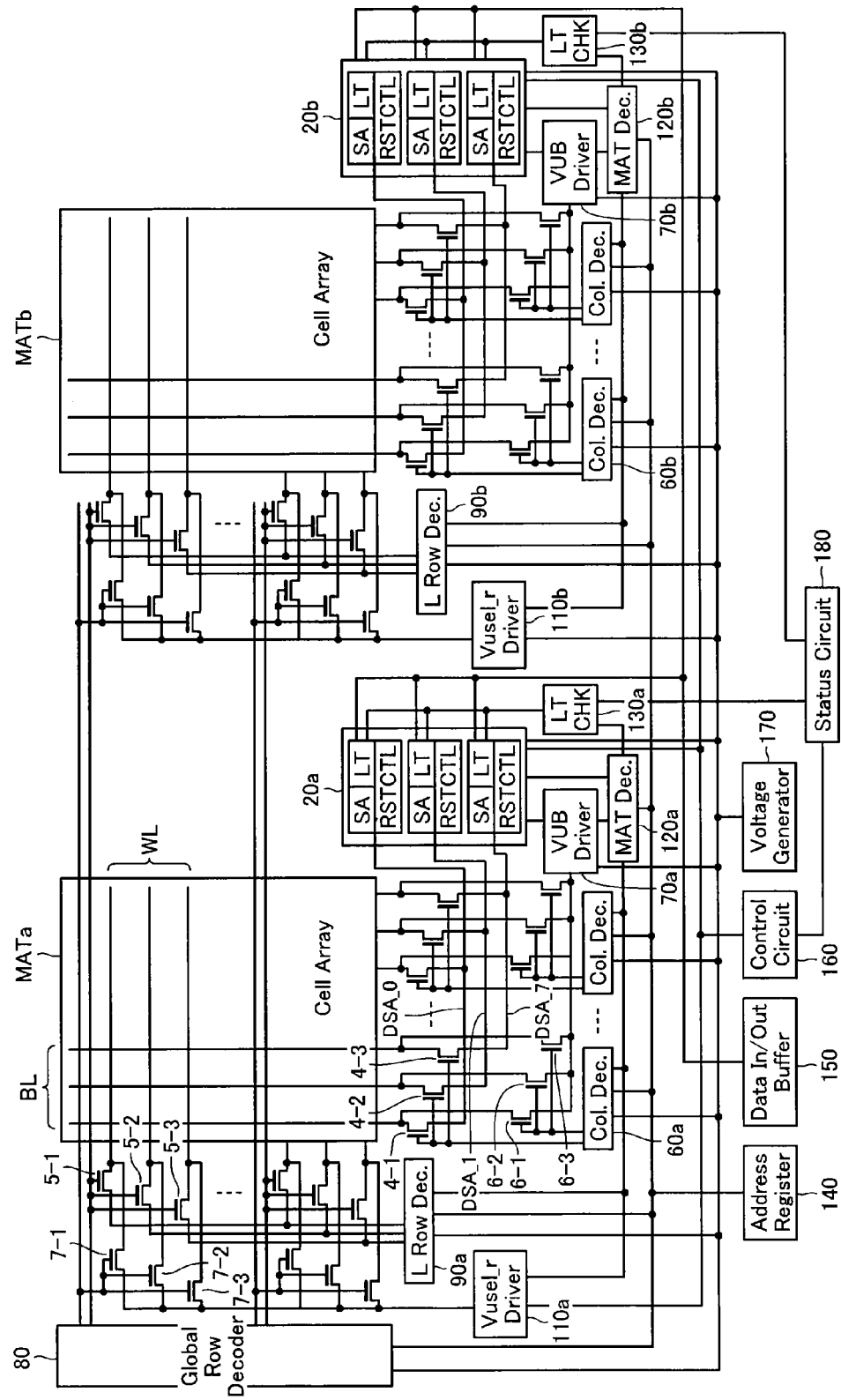
FIG. 4 is a circuit diagram showing the configuration of peripheral circuits of the resistance change memory according to a first embodiment of the present invention.

FIG. 4 shows the configuration of peripheral circuits of the resistance change memory according to the present embodiment. Here, two memory cell arrays (hereinafter, referred to as memory mats) MATa and MATb are representatively shown. Peripheral circuits include the data control circuit 20, a column decoder 60, an unselected bit line driving circuit 70, a global row decoder 80, a local row decoder 90, an unselected word line driving circuit 110, a mat decoder 120, a latch data check circuit 130, an address register 140, a data input/output buffer 150, a control circuit 160, a voltage generator 170, and a status circuit 180.

Components needed for each memory mat MAT such as the column decoder 60 and the local row decoder 90 are distinguished in FIG. 4 by subscripts such as a and b.

The bit lines BL are connected to the data control circuit 20 via the bit line selection transistors 4-1 to 4-3. As described later, the data control circuit 20 has a sense amplifier circuit SA to detect read data, a latch circuit LT to temporarily hold read data and write data, and a pulse control circuit RSTCTL. The bit lines BL are also connected to unselected voltage supply transistors 6-1 to 6-3.

If the bit line BL is unselected, the bit line BL is connected to the unselected bit line driving circuit 70 via the unselected voltage supply transistors 6-1 to 6-3 to supply a predetermined unselected bit line voltage in accordance with a selected operation.

A gate of the bit line selection transistor 4 is supplied with a predetermined gate signal, then the bit lines BL are charged up to a voltage corresponding to the magnitude of the gate signal (a voltage obtained by subtracting the threshold voltage of the bit line selection transistor 4 from the voltage of the gate signal). If a voltage of the bit lines BL is about to rise beyond the voltage, the bit line selection transistor 4 is cut off, thereby setting the bit lines BL in a floating state. For example, if the voltage of the gate signal of the bit line selection transistor 4 drops after the bit lines BL are charged or the voltage of the bit lines BL further rises after the bit lines BL are charged via the bit line selection transistor 4, the bit line selection transistor 4 is cut off.

The word lines WL are connected to the local row decoder 90 via the word line selection transistors 5-1 to 5-3. The word lines WL are connected to unselected voltage supply transistors 7-1 to 7-3. If the word line WL is unselected, the word line WL is connected to the unselected word line driving circuit 110 via the unselected voltage supply transistors 7-1 to 7-3 to supply a predetermined unselected word line voltage in accordance with a selected operation.

In FIG. 4, a row decoder has a hierarchical structure including the global row decoder 80 and the local row decoder 90 prepared for each memory mat MAT. Selection of the word line is made based on this hierarchical structure. In the row decoder in FIG. 4, both the word line selection transistors 5-1 to 5-3 and the unselected voltage supply transistors 7-1 to 7-3 are made of NMOS transistors. In this case, although not shown, an output signal of the global row decoder 80 is a complementary signal to drive the gate of each of these transistors.

Similarly, in FIG. 4, both the bit line selection transistors 4-1 to 4-3 and the unselected voltage supply transistors 6-1 to 6-3 are made of NMOS transistors. In addition, two complementary signals to control each gate of these transistors are output from the column decoder 60. The unselected voltage supply transistors 7-1 to 7-3 may be PMOS transistors. In that case, a decode signal output from the global row decoder 80 may be a single signal, instead of a complementary signal.

The mat decoder 120 is a decoder that selects the memory mat MAT. If the bit line and word line are not shared by the adjacent memory mats MAT, the unselected memory mat MAT can set both the bit line BL and the word line WL at 0 V. If the memory mat MATa is selected and the memory mat MATb is unselected, a mat decoder 120*a* outputs a decode signal MATSEL=H in a selected state and a mat decoder 120*b* outputs a decode signal MATSEL=L in an unselected state. Accordingly, the above-described voltage control necessary for data read and data programming caused by the set and reset operations is executed for the bit line BL and the word line WL on the selected memory mat MATa.

On the other hand, on the unselected memory mat MATb, all output signals from the local row decoder 90*b* are set at 0V, and all output signals from the unselected word line driving circuit 110*b* are set at 0 V in response to an output signal from the mat decoder 120*b*, unless the bit line BL and word line WL are shared by the adjacent memory mats MAT. Also, the output signal (potential of the wire DSA) of the data control circuit 20*b* is controlled to be set at 0 V, and all output signals of the unselected bit line driving circuit 70*b* are controlled to be set at 0 V. Naturally, the memory mat MATa and the memory mat MATb may be in a selected state at the same time.

The column decoder 60, the global row decoder 80, the local row decoder 90, and the mat decoder 120 operate based on address data supplied from the address register 140. Though details are not described here, like other general memory devices, preferable circuits in accordance with the present embodiment such as a pre-decoder circuit and a buffer for temporarily latching an address can be incorporated between the address register 140 and various decoders, if necessary.

The data input/output buffer 150 deals with data exchange between the outside of the chip and circuits (not shown) inside the chip connected to the latch circuit LT of the data control circuit 20 and temporarily holds data if necessary. The circuit 150 may also be configured like a NAND type flash memory so that commands and addresses are also input to chip via the data input/output buffer 150. Data programming and read operations are controlled by various control signals output from the control circuit 160 and the voltage output by the voltage generator 170.

The latch data check circuit 130 and the status circuit 180 are provided as circuits to play an auxiliary role in the operation control. These circuits have functions such as detecting whether data held in a data latch inside the data control circuit is in a predetermined state to give feedback of a detection result to the control circuit 160 and allowing a result of data programming operation (i.e., Pass or Fail) to be output to outside of the chip. Next, details of the data control circuit 20 will be described with reference to FIG. 5. As described above, the data control circuit 20 is generally made up of the sense amplifier circuit SA, the latch circuit LT, and the pulse control circuit RSTCTL.

The sense amplifier circuit SA includes a clamp transistor 21 and a differential amplifier 22. One end of the clamp transistor 21 is connected to the node DSA and the other end is connected to an inverting input terminal (sense node NSEN) of the differential amplifier 22. Though not shown in FIG. 5, the node DSA is connected to the bit line BL via the bit line selection transistor 4 described above. A reference voltage VREF_R is supplied to a non-inverting input terminal of the differential amplifier 22.

A capacitor 35 and NMOS transistors 36 and 37 are connected to between the node DSA and a ground terminal (or a VUB terminal (a terminal supplied with a voltage between 0 V and a forward direction voltage Vf of a diode (up to about 0.6 V) is applied)). The NMOS transistor 36 has a function to discharge the node DSA to the ground potential (the potential of the VUB terminal) when a short-circuit signal G_GND described later is supplied to a gate thereof.

The NMOS transistor 37 has a gate connected to an output terminal of a NOR gate 38. Signals RVFY_P, SET_P, RESET_P are supplied to an input terminal of the NOR gate 38. The signal RVFY_P rises to "H" when a read voltage is applied to the bit line for a read or verify operation. The signal SET_P rises to "H" when a set voltage is applied to the bit line for a set operation. The signal RESET_P rises to "H" when a reset voltage is applied to the bit line for a reset operation.

A current mirror circuit CM made up of NMOS transistors 32*a* and 32*b* and PMOS transistors 33*a*, 34*a*, 33*b*, and 34*b* is connected to the sense node NSEN. The current mirror circuit having a switch control function is formed by the PMOS transistors 33*a*, 34*a*, 33*b*, and 34*b*. Also, the NMOS transistors 32*a* and 32*b* are connected in parallel between the PMOS transistor 33*a* and the ground terminal, thereby a current being supplied to the current mirror circuit.

The NMOS transistor 32*a* becomes conductive based on a signal G_IREF_R when a reference current is supplied to the node DSA, while the NMOS transistor 32*b* becomes conductive based on a signal PRECHG when, as described later, the selected bit line BL is pre-charged.

The basic operation of the sense amplifier circuit SA is as follows: A cell current flows into the selected memory cell MC while clamping the potential of the bit line BL by the clamp transistor 21. The reference current is poured into the sense node NSEN from the current mirror circuit CM. A change in potential of the sense node NSEN due to a difference between the cell current and the reference current is determined by the differential amplifier 22.

Output of the differential amplifier 22 is latched in the latch circuit LT as output of the sense amplifier circuit SA. The latch circuit LT is formed by cross-coupling clocked inverters 27a and 27b. The input terminal of the clocked inverter 27a is defined as a node DC and the output terminal thereof as a node DCn.

An NMOS transistor 26a sets the node DC to "H" by a gate signal RST_U. Conversely, an NMOS transistor 26b sets the node DC to "L" by a gate signal SEL_ALL.

Further, two PMOS transistors 24 and 25 connected in series are connected to the node DC to latch output of the differential amplifier 22 into the latch circuit LT. An output signal of the differential amplifier 22 is supplied to a gate GP of the PMOS transistor 24 via a data transfer circuit 23. The PMOS transistor 25 is connected to between the source of the PMOS transistor 24 and a power supply terminal (common to the power supply terminal of the latch circuit LT) and can change the node DC to "H" when a gate signal STRBn becomes "L". That is, if a node GP is at "L", the PMOS transistor 25 can change the node DC to "H" and if the node GP is at "H", the node DC can retain the previous state.

Next, the configuration of a voltage control circuit CTRL to cause the state of the latch circuit LT to be reflected in control of the bit line BL will be described. The voltage control circuit CTRL includes a NOR gate 29a, an inverter 29b, a NAND gate 29c, a level shifter 30, and inverters 31a and 31b.

The NOR gate 29a and the inverter 29b function as logical gate units that prevent output of the latch circuit LT from affecting control of the bit line BL when a signal RVFY is "H" (that is, when a read operation or verify operation is performed. Hereinafter, referred to as a "read-related operation"). That is, the node DCn is connected to one of the input terminals of the NOR gate 29a and the state of the node DCn is configured to be ignored by the signal RVFY being switched to "H". That is, in a read-related operation, a read operation can be performed in a predetermined data control circuit 20 selected by the signal RVFY and is not affected by data held by the latch circuit LT.

As shown in FIG. 4, the semiconductor storage apparatus comprises a plurality of the data control circuits 20. In addition, the signals RVFY each provided to each of the data control circuits 20 can be grouped into signals (for example, RVFY_a and RVFY_b) based on, for example, the address or data input/output terminal I/O. If these signals are common for all of the data control circuits 20, all of the data control circuits 20 are activated at the same time, and a read-related operation is performed. If, for example, the signal RVFY_a and the signal RVFY_b are controlled separately, only the data control circuit 20 into which a predetermined signal is input can be activated, for example, only the data control circuit 20 into which the signal RVFY_a is input is activated while the signal RVFY_b is not operated. This is because it is desirable that a verify operation and a read operation be caused to be performed under the same conditions if possible. The signal RVFY is grouped because the number of the data control circuits 20 to be activated is thereby limited, and in addition, the amount of current poured from the bit line into the word like is adjustable.

On the other hand, however, if the signal RVFY is not "H", control by the signal RVFY is not performed, but an operation based on data of the latch circuit LT may be performed.

An output signal DCOUTn from the inverter 29b is supplied to the NAND gate 29c together with a signal MATSEL and a signal RESET_Pn. The signal MATSEL is a signal that is at "L" in a standby state or when no memory mat MAT is selected.

When the signal MATSEL is at "L", a signal G_PCM1 is switched to "H" via the level shifter 30, thereby turning off the PMOS transistors 33a and 33b to stop the operation of the current mirror circuit CM.

Also, a signal G_GND is switched to "H" via the inverters 31a and 31b, thereby turning on the NMOS transistor 36, to discharge the node DSA up to the ground potential or the potential of the VUB terminal.

Figure 5:
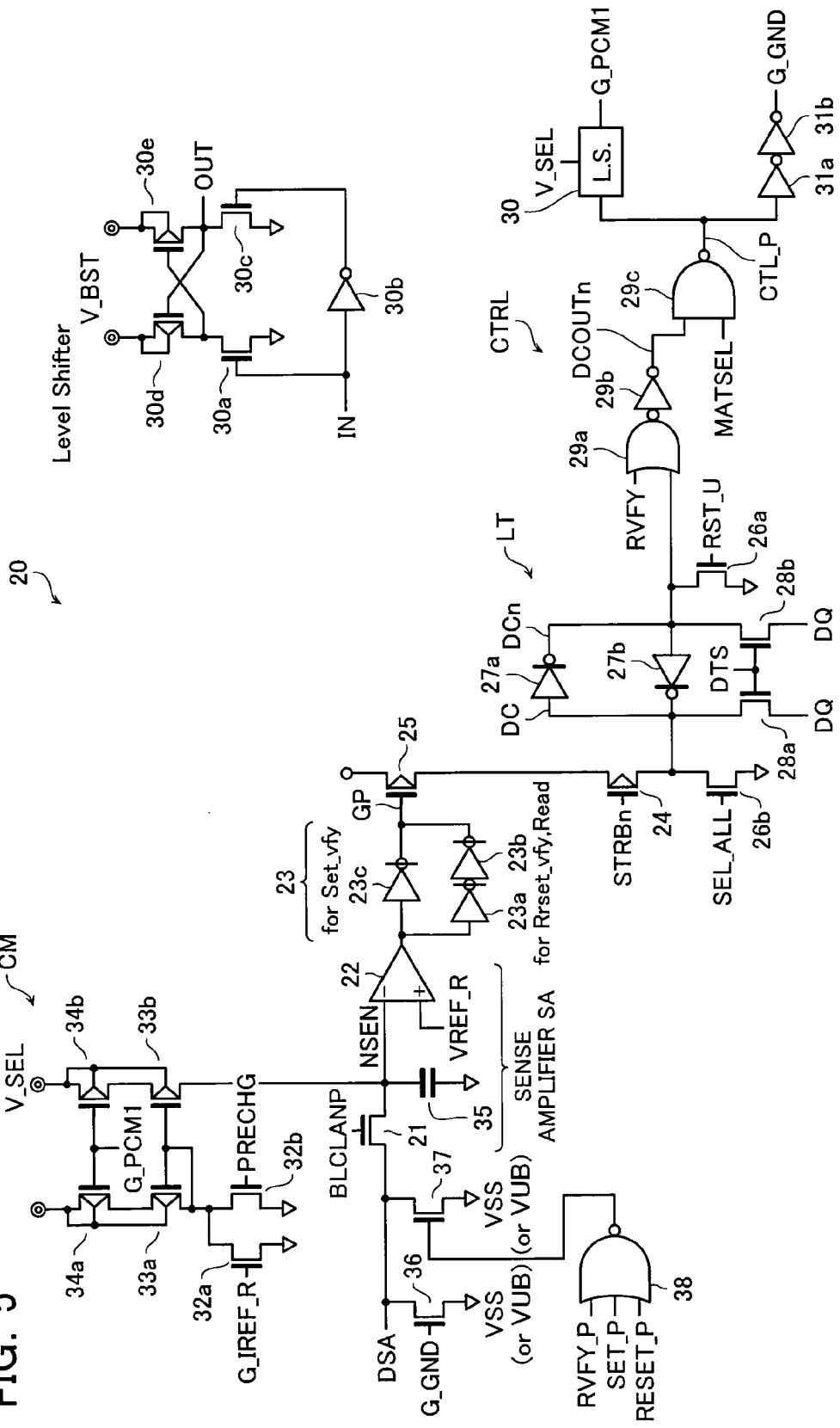
FIG. 5 is a circuit diagram illustrating details of a data control circuit 20.

An output signal CTL_P of the NAND gate 29c is supplied to the inverter 31a as an input signal. The output signal of the inverter 31a is further supplied to the inverter 31b and the inverter 31b outputs the aforementioned signal G_GND. The level shifter 30 is configured by connecting, for example, NMOS transistors 30a and 30c, PMOS transistors 30d and 30e, and an inverter 30b as shown in FIG. 5. The transistors 30a and 30d and the transistors 30c and 30e are each connected between the power supply terminal and the ground terminal with the gate and drain of the transistors 30d and 30e cross-connected. The gate of the transistor 30a is connected to an input terminal of the level shifter 30. The gate of the transistor 30c is connected to the input terminal of the level shifter 30 via the inverter 30b.

An output signal G_PCM1 output from an output terminal OUT of the level shifter 30 is a voltage V_BST after the level shift. Though the power supply before the level shift is not shown, the power supply is the same as that of the inverter 30b (for example, Vdd). The aforementioned signal CTL_P is supplied to an input terminal IN of the level shifter 30 and a signal V_SEL corresponds to the aforementioned voltage V_BST.

Next, the set operation in a memory according to the present embodiment will be described with reference to the timing chart in FIG. 6 and simplified circuit diagrams shown in FIGS. 7 to 9. In a memory with a plurality of memory mats MAT, the wire length of peripheral circuits tends to become longer, increasing a parasitic capacitance generated in wires of the peripheral circuits. The present embodiment performs an operation described below so that malfunction can be prevented even if the parasitic capacitance is large.

Figure 6:
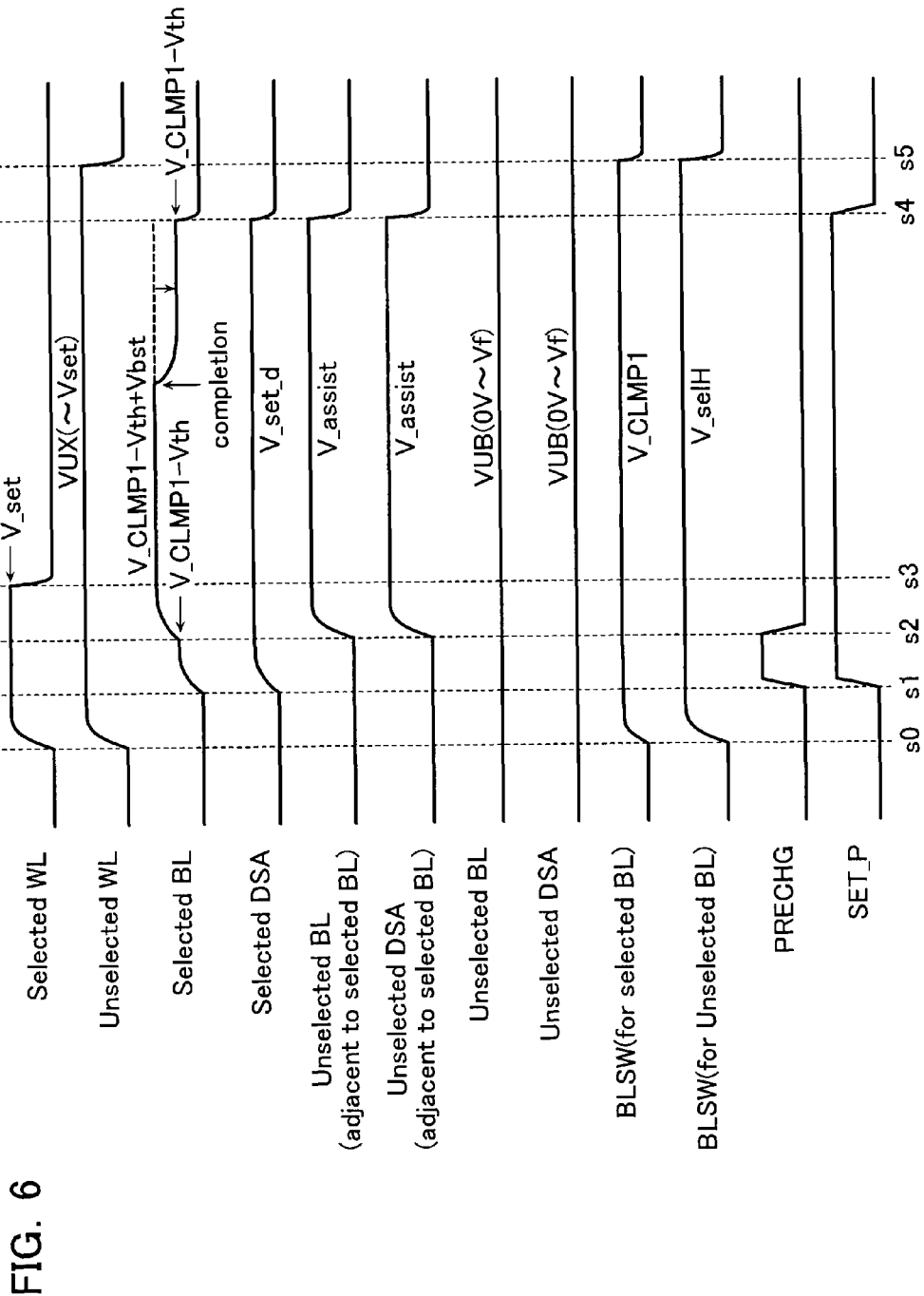
FIG. 6 is a timing chart illustrating a set operation in the memory in the first embodiment of the present invention.

As shown in FIG. 6, first at time s0, the potential of all of the word lines WL in the selected memory mat MAT is charged to V_set and a gate signal BLSW supplied to the gate of the bit line selection transistor 4 is switched to V_CLMP1 for the selected bit line BL2 (for selected BL) and to V_SelH for the unselected bit line BL (for non-selected BL).

Then, at time s1, the signal SET_P rises to "H", and further the signal PRECHG rises to "H" for a short period, thereby the node DSA being charged to a voltage V_set_d. The magnitude of the selected voltage V_set_d alone is insufficient to boost the selected bit line BL2 to a voltage necessary for a set operation. If the selected memory cell MC is already in a set state and thus, there is no need for pulse application, 0 V or VUB (unselected bit line voltage) is applied to the node DSA.

Figure 7:
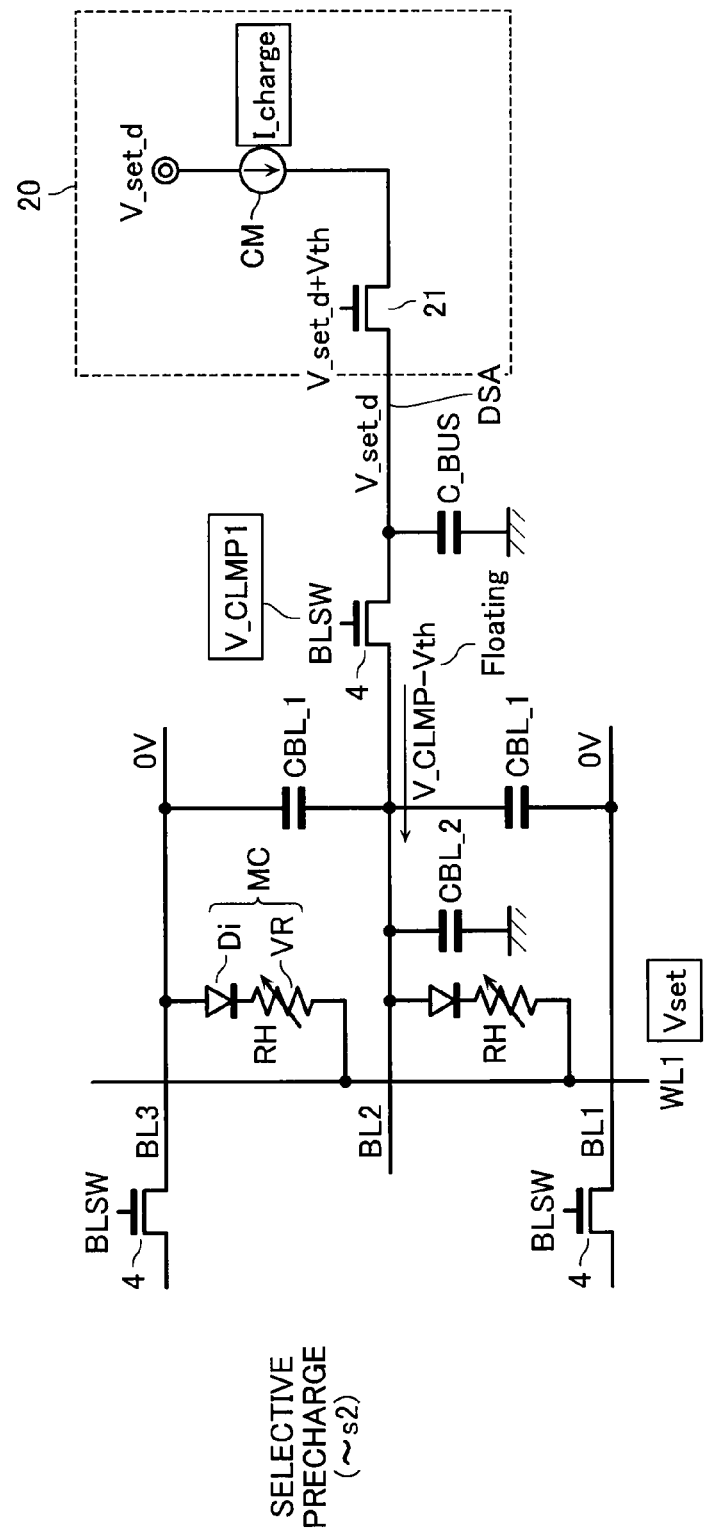
FIG. 7 is a simplified circuit diagram illustrating the set operation in the memory in the first embodiment.

At this point, as shown in FIG. 7, the voltage of the gate signal BLSW of the bit line selection transistor 4 connected to the selected bit line BL2 is set to V_CLMP1 (<V_set_d+Vtn, where Vtn is the threshold voltage of the bit line selection transistor 4). Thus, the selected bit line BL2 (Selected BL) is charged up to the voltage V_CLMP1-Vtn. Then, the bit line selection transistor 4 is turned off to set the bit line BL2 in a floating state. The magnitude of the voltage V_CLMP1-Vtn is insufficient for a set operation of the selected memory cell MC.

Figure 8:
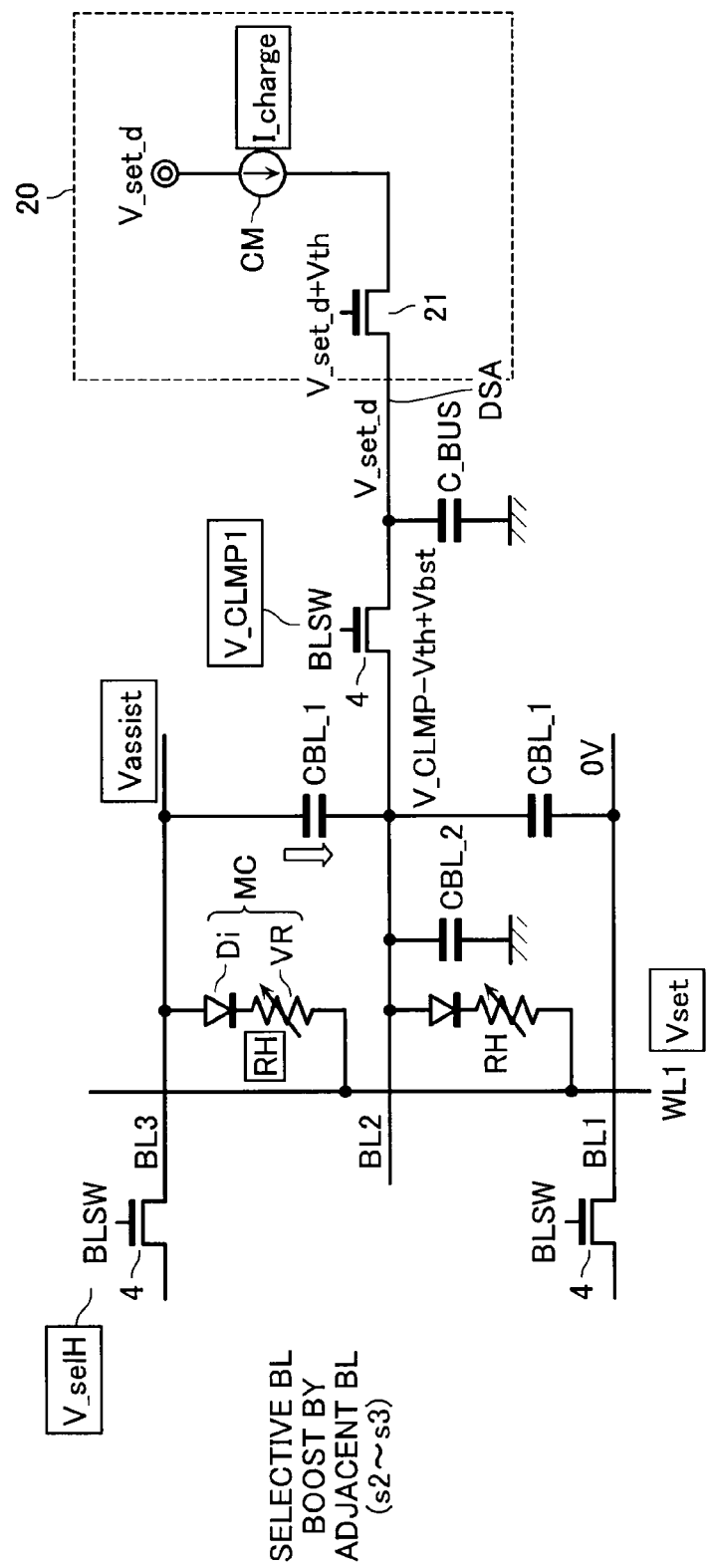
FIG. 8 is a simplified circuit diagram illustrating the set operation in the memory in the first embodiment.

Next, at time s2, as shown in FIG. 8, a voltage V_assist is applied to the bit line BL3 (Non-selected BL (Adjacent to Selected BL)) adjacent to the selected bit line BL2 (Selected BL). The bit line BL3 is connected to memory cells MC that are subject to the set operation later than the selected memory cell MC that is currently selected (in other words, the set operation therefor is not completed yet at this point of time). The voltage V_assist is a voltage to boost the potential of the bit line BL2 (Selected BL) currently selected and in a floating state, using coupling between the bit lines BL.

The reason why the voltage V_assist is applied to the bit line BL connected to the memory cell MC for which a set operation is not completed yet is as follows: If the voltage V_assist is applied to a bit line connected to a memory cell MC for which a set operation is already completed, there is a possibility that an erroneous reset occurs in the memory cell MC for which a set operation is already completed. However, even an unselected bit line connected to a memory cell for which a set operation is completed may be provided with a certain voltage without causing any problem, as long as the certain voltage is sufficiently small. In that case, the design can be changed so that a certain voltage may be applied to the unselected bit line in order to assist charging of the selected bit line. That is, the present invention does not exclude application of a voltage to the unselected bit line connected to a memory cell for which a set operation is already completed in order to assist charging of the selected bit line.

As shown in FIG. 8, the memory cell connected to the adjacent bit line BL3 is in the "not-set" state, i.e., high-resistance state RH according to rules of the order of a set operation. Since the voltage V_assist is set lower than the voltage that sets a memory cell MC (high-resistance state RH) for which a set operation is not completed, a large current will not flow through the unselected memory cell so that the voltage V_assist can be applied to the bit line BL3 with stability.

With application of the voltage V_assist to the bit line BL3, the voltage of the selected bit line BL2 rises from the voltage V_CLMP1-Vtn to the voltage V_CLMP1-Vtn+Vbst by coupling between bit lines. Here, if the parasitic capacitance between the two bit lines is CBL_1 and the total of parasitic capacitance of all bit lines is CBL_all, the aforementioned voltage Vbst is substantially equal to (CBL_1/CBL_all) *V_assist.

Next, at time s3, the voltage of the selected word line WL1 falls from V_set to 0 V. Accordingly, V_CLMP1-Vtn+Vbst is applied to between the selected bit line BL2 connected to the selected memory cell MC and the word line WL1. If this voltage is equal to or higher than the voltage V_set that sets the memory cell MC, the memory cell can be set (a transition from the high-resistance state to the low-resistance state can be caused).

Figure 9:
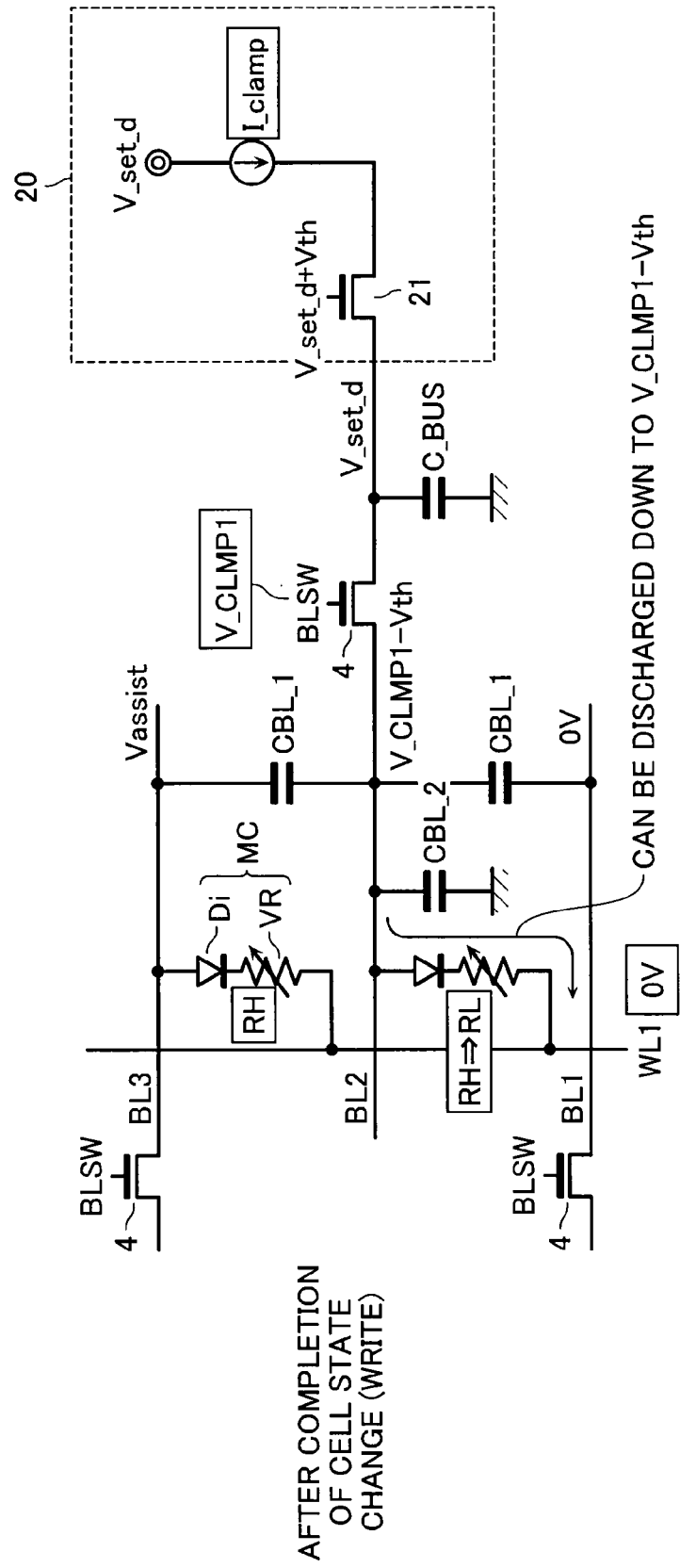
FIG. 9 is a simplified circuit diagram illustrating the set operation in the memory in a second embodiment.

FIG. 9 shows a state immediately after the selected memory cell MC is "set". With a change of the selected memory cell MC from the high-resistance state to the low-resistance state, charges of the selected bit line BL2 pass through the memory cell MC, and are discharged to the word line WL1.

Now, the voltage of the signal BLSW provided to the gate of the bit line selection transistor 4 connected to the selected bit line BL2 is V_CLMP1. Thus, if the potential of the bit line BL2 changes to the bit line V_CLMP1-Vtn or below after completion of the set operation of the selected memory cell MC, the bit line selection transistor 4 is switched from off to on.

When the potential of the bit line BL2 drops to the level before the potential rise (time s2), all charges accumulated in the capacitance CBL_1 of the bit line BL2 and the capacitance C_BUS of the node DSA flows into the bit line BL2. However, before the potential drops to that level, charges that pass through the selected memory cell MC are limited to those charges originating from the capacitance CBL_1 of the bit line BL2. Specifically, charges that pass through the selected memory cell MC is nearly equal to (2*CBL_1+ CBL_2)×Vbst=CBL_1*V_assist (CBL_2 indicates a parasitic capacitance of the selected bit line BL). Since an influence of the capacitance C_BUS is excluded, the risk of an erroneous reset in which a "set" memory cell is erroneously brought to "reset" again can be decreased.

For example, when the bit line capacitance CBL_1 is 0.3 pF, the capacitance of the node DSA C_BUS is 1.5 pF, VCLMP1-Vtn is 2 V, and V_assist is 2 V, the potential of the selected bit line BL2 after being boosted by the adjacent bit line BL3 becomes 2.86 V.

Then, it is assumed that the voltage of the bit line BL2 drops to 2 V after the selected memory cell MC changes to a set state. In this case, the amount of charge that passes through the selected memory cell MC by the method is 6.0e-13 [C]. If such a bit line boost is not used and it is assumed that the voltage of the bit line drops to 2 V under similar conditions, the amount of charge can be calculated like Q=(CBL_all+ c_BUS)*ΔV=(0.7 pF+1.5 pF)*(2.86V−2V)=1.89e−12 [C]. That is, the amount of passing charges can be reduced by 32%, compared with the conventional art.

Second Embodiment

Next, the second embodiment of the present invention will be described with reference to FIG. 10. The overall circuit configuration is substantially the same as that of the first embodiment and a description thereof is omitted.

Figure 10:
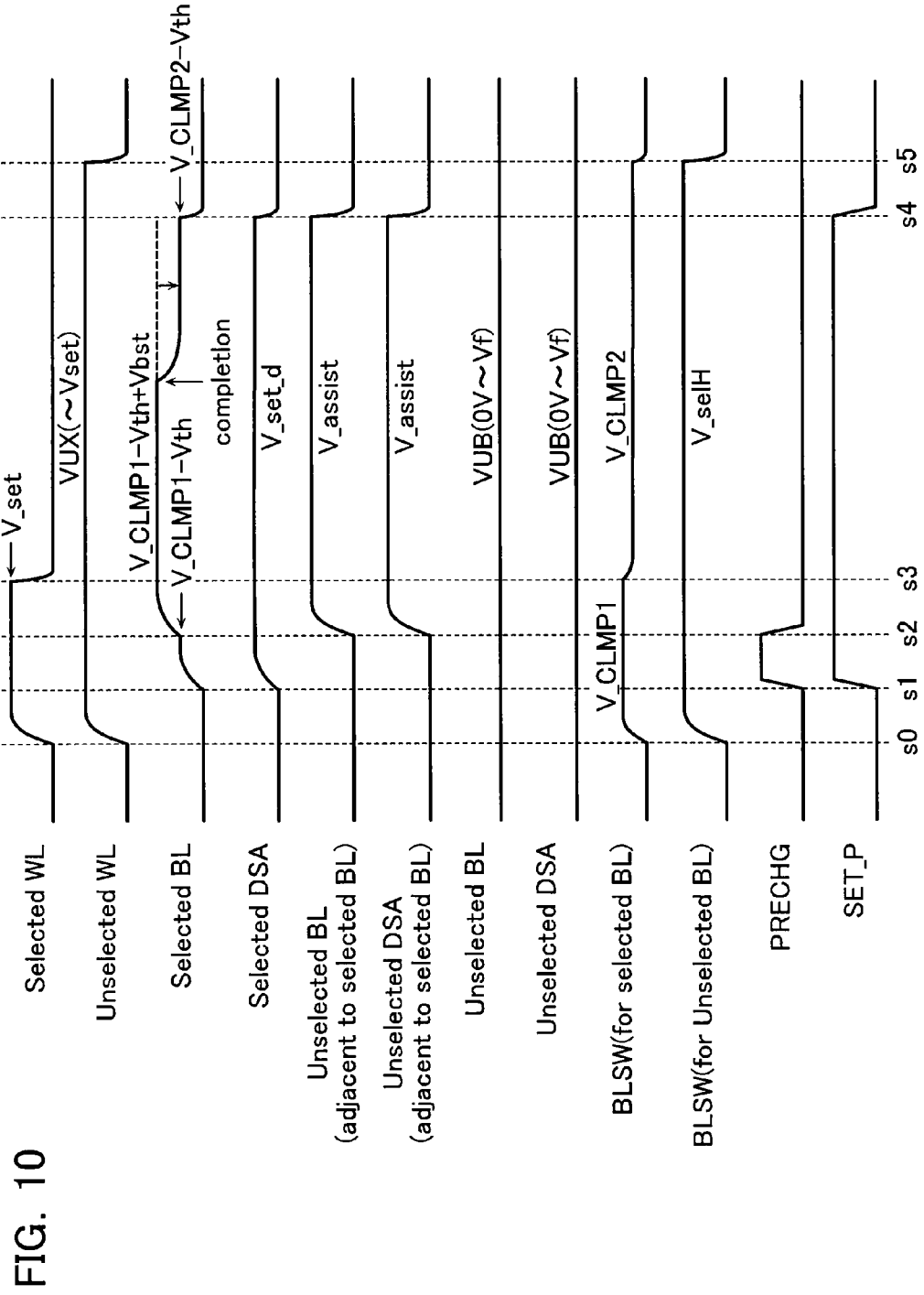
FIG. 10 is a timing chart illustrating the set operation in the memory in the second embodiment of the present invention.

As shown in FIG. 10, the second embodiment is different from the first embodiment in that the voltage of the signal BLSW applied to the gate of the bit line selection transistor 4 connected to the selected bit line BL2 is lowered to V_CLMP2, which is lower than V_CLMP1, at time s3. Accordingly, while the selected memory cell MC discharges the potential of the selected bit line BL2 after the selected memory cell MC changes to the low-resistance state by being set, the parasitic capacitance C_BUS of the node DSA can be prevented from being connected to the bit line BL2 before the bit line reaches a still lower bit line voltage. Accordingly, an influence of the parasitic capacitance C_BUS of the node DSA can further be reduced.

Third Embodiment

Next, the third embodiment of the present invention will be described with reference to FIG. 11. The overall circuit configuration is substantially the same as that of the first embodiment and a description thereof is omitted.

Figure 11:
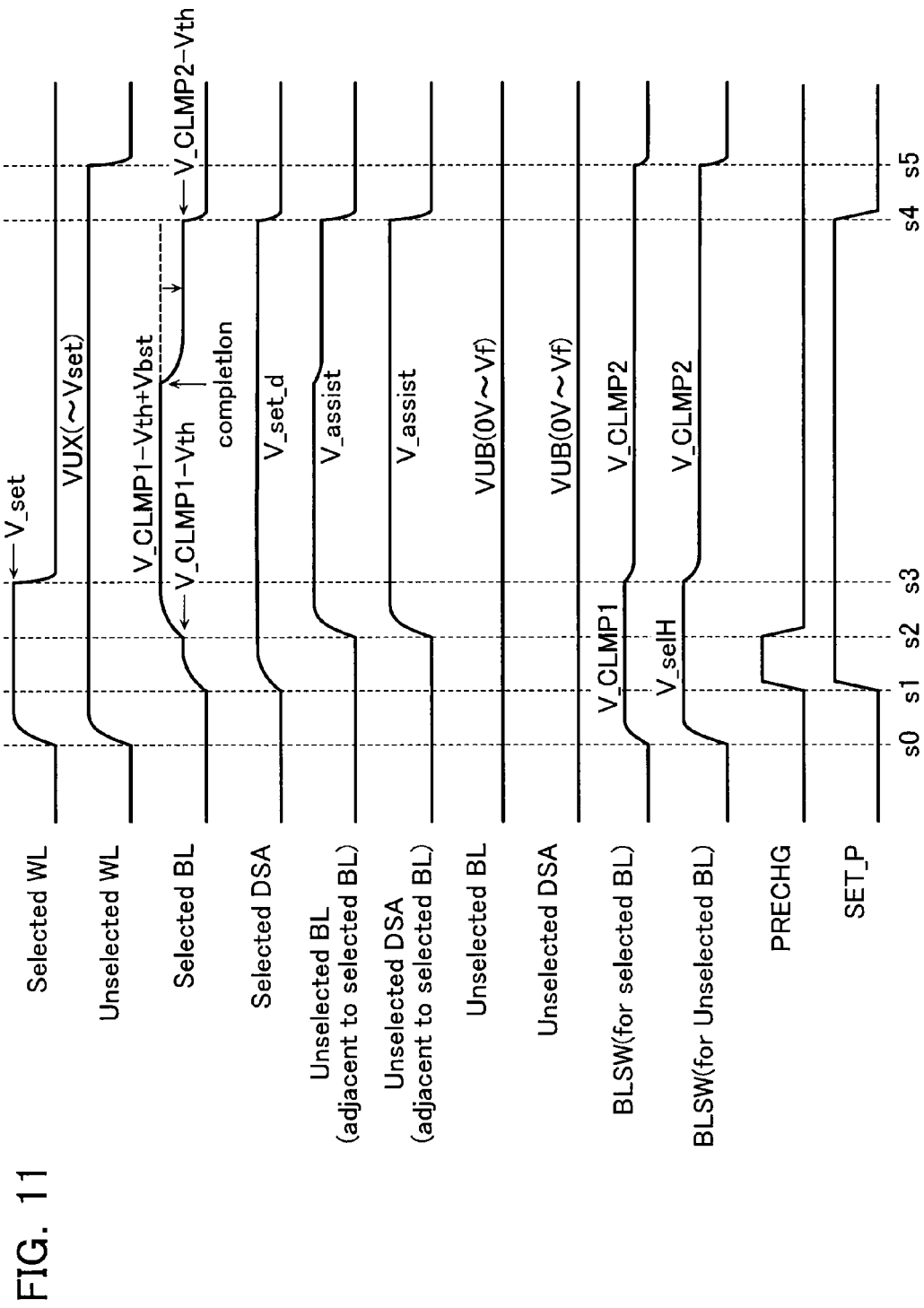
FIG. 11 is a timing chart illustrating the set operation in the memory in a third embodiment of the present invention.

As shown in FIG. 11, the third embodiment is different from the second embodiment in that the voltage of the gate signal BLSW of the bit line selection transistor 4 connected to the adjacent unselected bit line BL3 to which the voltage V_assist is applied is lowered from V_selH to V_CLMP2 at time s3.

In this operation, the adjacent unselected bit line BL3 is in a floating state, after the selected bit line BL2 being boosted by application of the voltage V_assist, until the potential of the bit line BL2 drops to VCLMP2-Vtn or below after time s3. The parasitic capacitance of the selected bit line BL2 is thereby reduced so that the amount of charges poured into the selected memory cell MC can further be reduced.

Fourth Embodiment

Next, the fourth embodiment of the present invention will be described with reference to FIG. 12.

Figure 12:
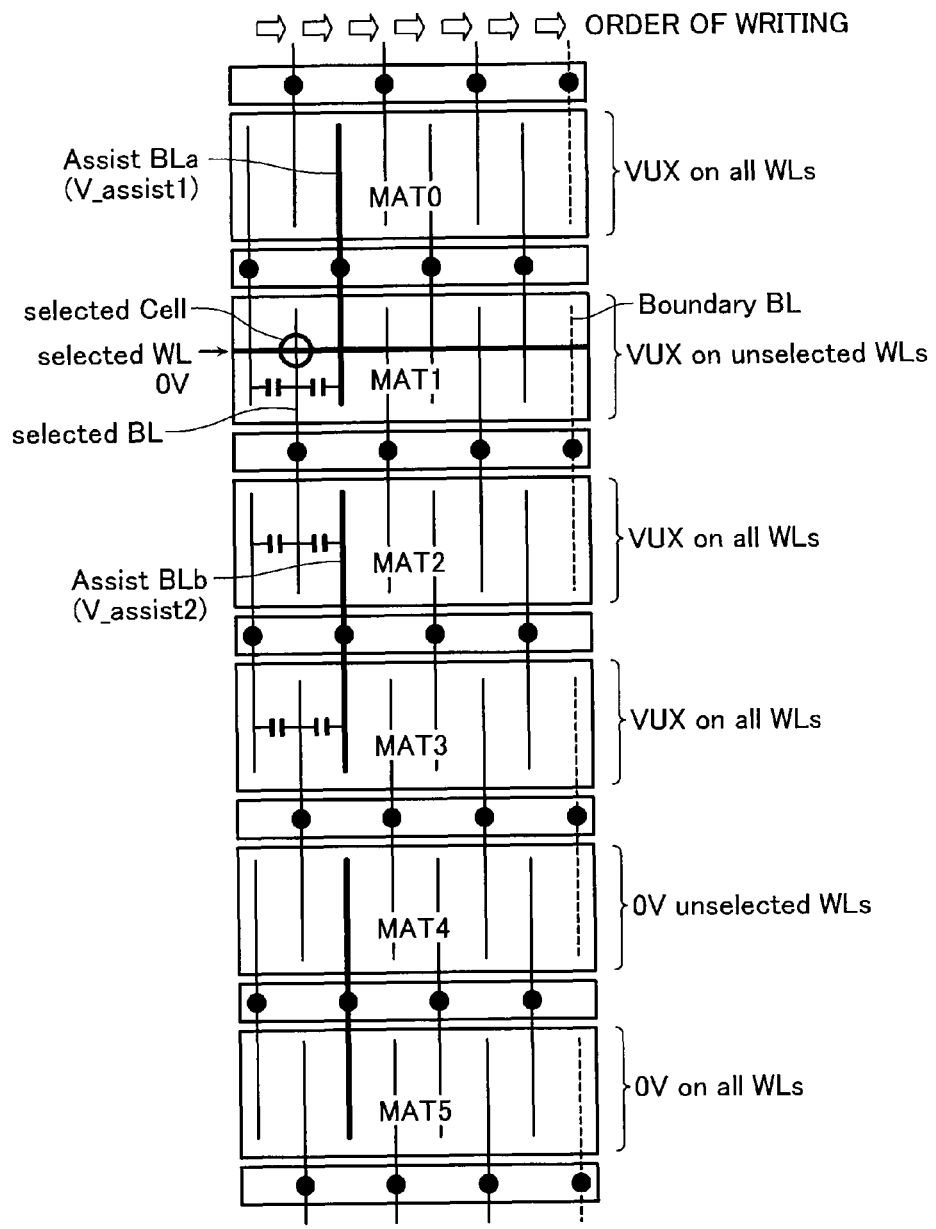
FIG. 12 is a schematic diagram showing a schematic configuration of the memory in a fourth embodiment of the present invention and an operation method thereof.

In the fourth embodiment, as shown in FIG. 12, a plurality of memory mats MAT (six memory mats MAT 0 to 5 in FIG. 12) is arranged in the same direction as a longitudinal direction of the bit line BL. Then, the bit line BL is shared by two adjacent memory mats MAT and bit lines adjacent to each other in one memory mat MAT are pulled out in opposite directions (for example, one of two adjacent bit lines in the memory mat MAT1 is pulled out to the memory mat MAT0 and the other bit line to the memory mat MAT2).

Here, it is assumed that the memory cell MC in the memory mat MAT1 is selected. That is, as shown in FIG. 12, the selected word line WL (selected WL) crosses the memory mat MAT1 and the voltage 0 V is applied to the selected word line WL in predetermined timing. The voltage VUX (equivalent to V_set) is applied to other unselected word lines WL in the memory mat MAT1 and also the voltage VUX is applied to all word lines in other unselected memory mats MAT0, MAT2, and MAT3.

As described above, the bit line BL is arranged in such a way that the bit line BL is shared by two memory mats MAT and, in FIG. 12, the selected bit line BL (Selected BL) is included in the memory mats MAT1 and MAT2. An unselected bit line BLa adjacent to the selected bit line BL is included in the memory mats MAT0 and MAT1 and another unselected bit line BLb adjacent to the selected bit line BL is included in the memory mats MAT2 and MAT3.

Like the other embodiments described above, a voltage V_assist1 is applied to the adjacent unselected bit line BLa and a voltage V_assist2 to the unselected bit line BLb to boost the selected bit line BL by coupling between bit lines after charging of the selected bit line BL is completed.

Here, the above configuration can be put in other words like: The selected bit line BL connected to the selected memory cell MC is shared by the (n+1)-th (n is a natural number) and the (n+2)-th memory mats MAT1 and MAT2. The voltage V_assist1 is applied to the unselected bit line BLa shared by the n-th and the (n+1)-th memory mats MAT0 and MAT1. The voltage V_assist2 different from the voltage V_assist1 is applied to the unselected bit line BLb shared by the (n+2)-th and the (n+3)-th memory mats MAT2 and MAT3.

Since there are restrictions on the order in which the set operation is performed in the embodiment described above, as indicated by outline arrows in the upper part of FIG. 12, for example, there are restrictions on performing the set operation sequentially from a cell on the left side toward cells on the right side. That is, the adjacent bit line BLa that is adjacent to the selected bit line BL and to which the voltage V_assist1 is applied needs to be connected to a memory cell MC for which set operation is not completed yet. Therefore, a bit line Boundary BL to apply the voltage V_assist is provided in FIG. 12 to perform a similar bit line boost operation on the memory cell on which the set operation is performed lastly.

Here, taking a look at the adjacent unselected bit line BLb, the memory mats MAT2 and MAT3 have no selected word line WL (selected WL) to which 0 V is applied. All word lines in the memory mats MAT2 and MAT3 are unselected word lines to which the voltage VUX (equivalent to V_set) is applied. Therefore, the voltage V_assist2 applied to the unselected bit line BLb may be any voltage that does not exceed the voltage VUX.

On the other hand, the adjacent unselected bit line BLa crosses the selected word line WL to which 0 V is supplied and thus, it is necessary to set the voltage V_assist1 within a range in which the memory cell MC at the point of intersection thereof is not "set" (does not change from the high-resistance state to the low-resistance state).

Figure 13:
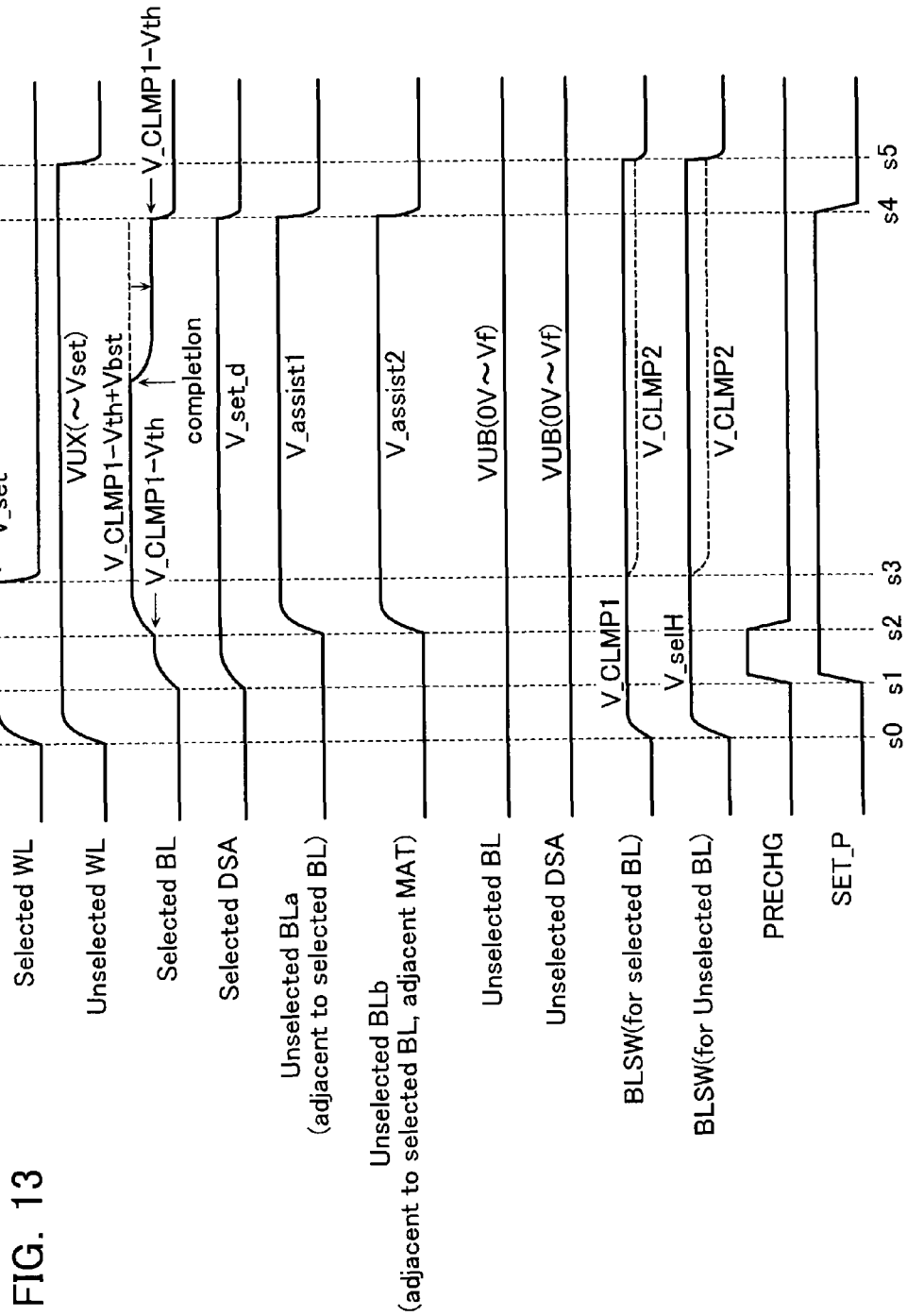
FIG. 13 is a timing chart illustrating the set operation in the memory in the fourth embodiment of the present invention.
Figure 14:
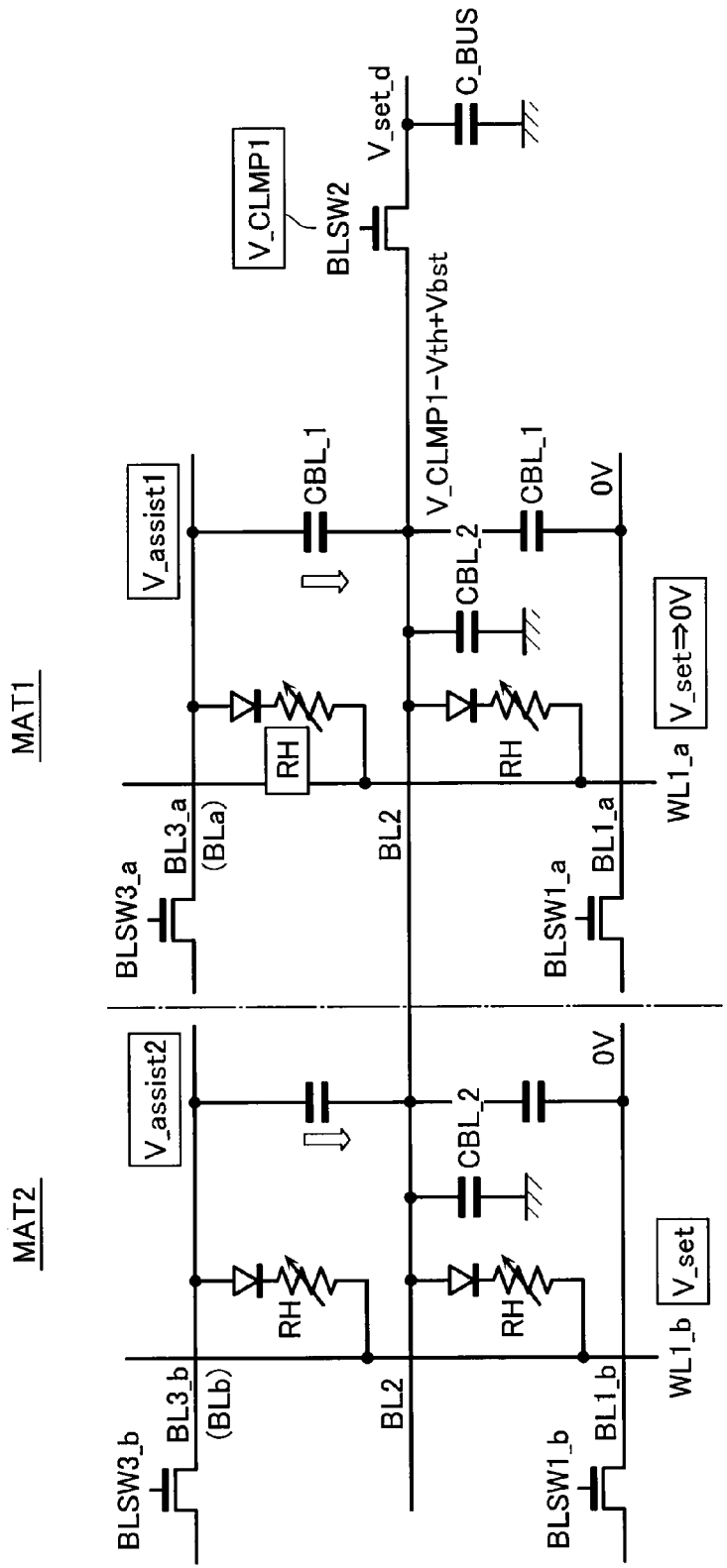
FIG. 14 is a simplified circuit diagram illustrating the set operation in the memory in the fourth embodiment of the present invention.

FIG. 13 shows timing waveforms when a set operation is performed by applying the different voltages V_assist1 and V_assist2 to the adjacent unselected bit lines BLa and BLb. Other portions are the same as those of the above embodiments and a duplicate description is omitted. FIG. 14 shows a state in which the memory mat MAT1 is selected and a set operation is performed on the memory cell MC at the point of intersection of the selected bit line BL2 and a word line WL1_a. In FIG. 14, a bit line BL3_a corresponds to the aforementioned unselected bit line BLa and a bit line BL3_b to the aforementioned unselected bit line BLb. V_assist2 can be set higher in the present embodiment than in the above embodiments so that there is an advantage that the voltage after the selected bit line BL being boosted can easily be increased.

Fifth Embodiment

Figure 15:
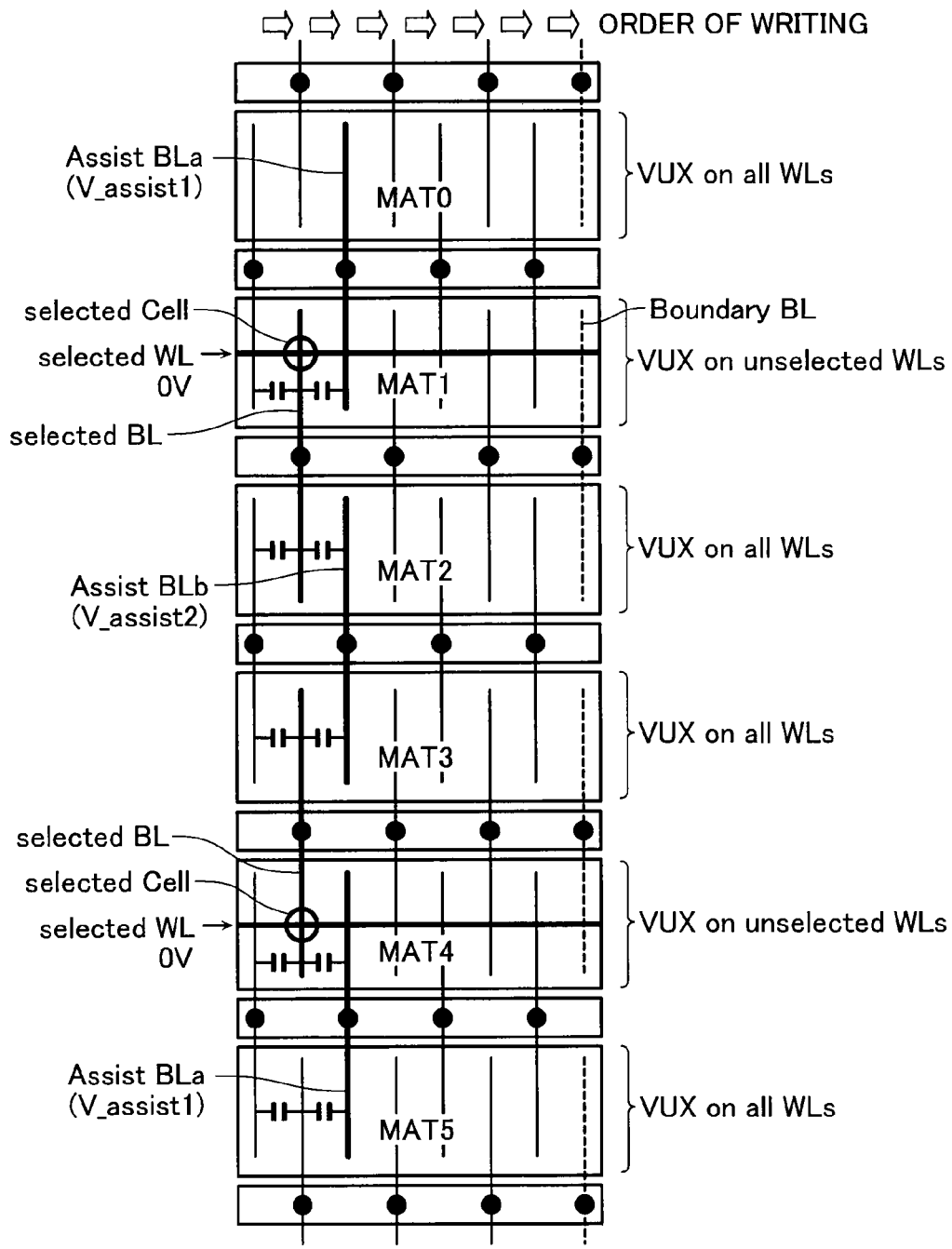
FIG. 15 is a schematic diagram showing the schematic configuration of the memory in a fifth embodiment of the present invention and the operation method thereof.

Next, the fifth embodiment of the present invention will be described with reference to FIG. 15.

In the fifth embodiment, like the fourth embodiment, a plurality of memory mats MAT is arranged in the same direction as the longitudinal direction of the bit line BL, the bit line BL is shared by two adjacent memory mats MAT, and bit lines BL adjacent to each other in one memory mat MAT are pulled out in opposite directions.

However, the present embodiment is different from the fourth embodiment in that, among the plurality of memory mats MAT, two or more memory mats MAT are simultaneously selected, instead of selecting a single memory mat MAT. That is, in the present embodiment, for example, as shown in FIG. 15, the memory mats MAT1 and MAT4 are simultaneously selected and one word line WL is selected in each of the memory mats MAT1 and MAT4 (0 V is applied in predetermined timing). Also, one bit line BL is selected in each of the memory mats MAT1 and MAT4.

Here, one bit line BL extending over the memory mats MAT1 and MAT2 is selected as a selected bit line, and one bit line BL extending over the memory mats MAT3 and MAT4 is selected as a selected bit line.

Then, the aforementioned voltage V_assist1 or V_assist2 is applied to the unselected bit lines BLa and BLb adjacent to the selected bit line BL extending over the memory mats MAT1 and MAT2. Like the fourth embodiment, which of V_assist1 and V_assist2 is applied is determined by whether or not the unselected bit line passes through the selected memory mat MAT.

In this embodiment, simultaneously operating the memory mats MAT1 and MAT4 arranged in the bit line direction may serve to substantially reduce the number of memory mats MAT in which a bias voltage is applied to unselected word lines as a measure against disturbance. Therefore, current consumption can be reduced.

Sixth Embodiment

Next, the sixth embodiment of the present invention will be described with reference to FIG. 16.

In the sixth embodiment, like the fourth embodiment, a plurality of memory mats MAT is arranged in the same direction as the longitudinal direction of the bit line BL, the bit line BL is shared by two adjacent memory mats MAT, and bit lines BL adjacent to each other in one memory mat MAT are pulled out in opposite directions.

However, in the present embodiment, in order to boost the voltage of the selected bit line BL in the selected memory mat MAT1, the voltage V_assist is applied to the unselected bit lines BLb on both sides of the selected bit line BL in the unselected adjacent memory mat MAT2 to assist in charging the selected bit line BL. The unselected bit lines BLb do not extend to the selected memory mat MAT1. Therefore, limitations on the order of performing a set operation in one memory mat can be eliminated.

Figure 16:
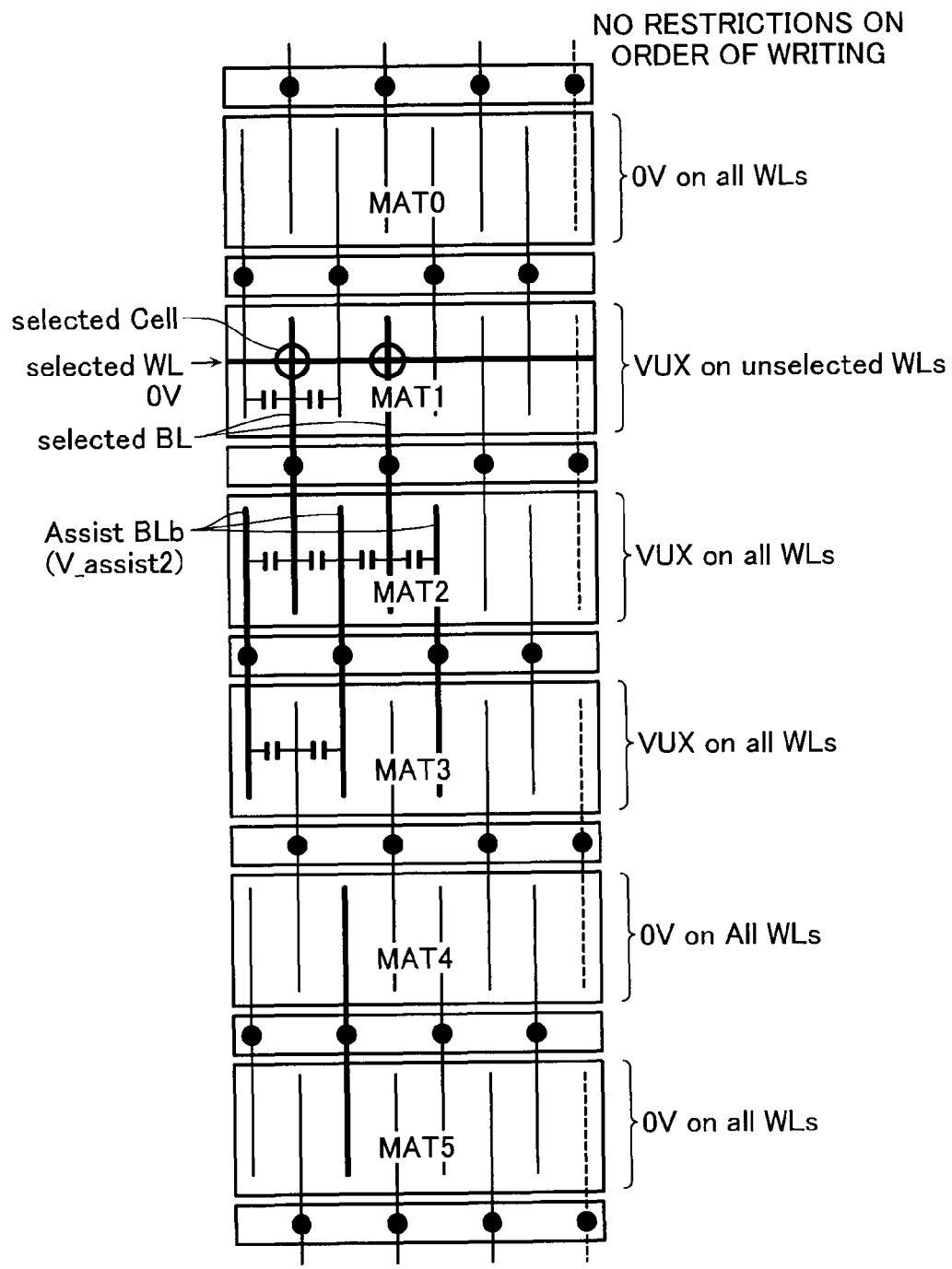
FIG. 16 is a schematic diagram showing the schematic configuration of the memory in a sixth embodiment of the present invention and the operation method thereof.
Figure 17:
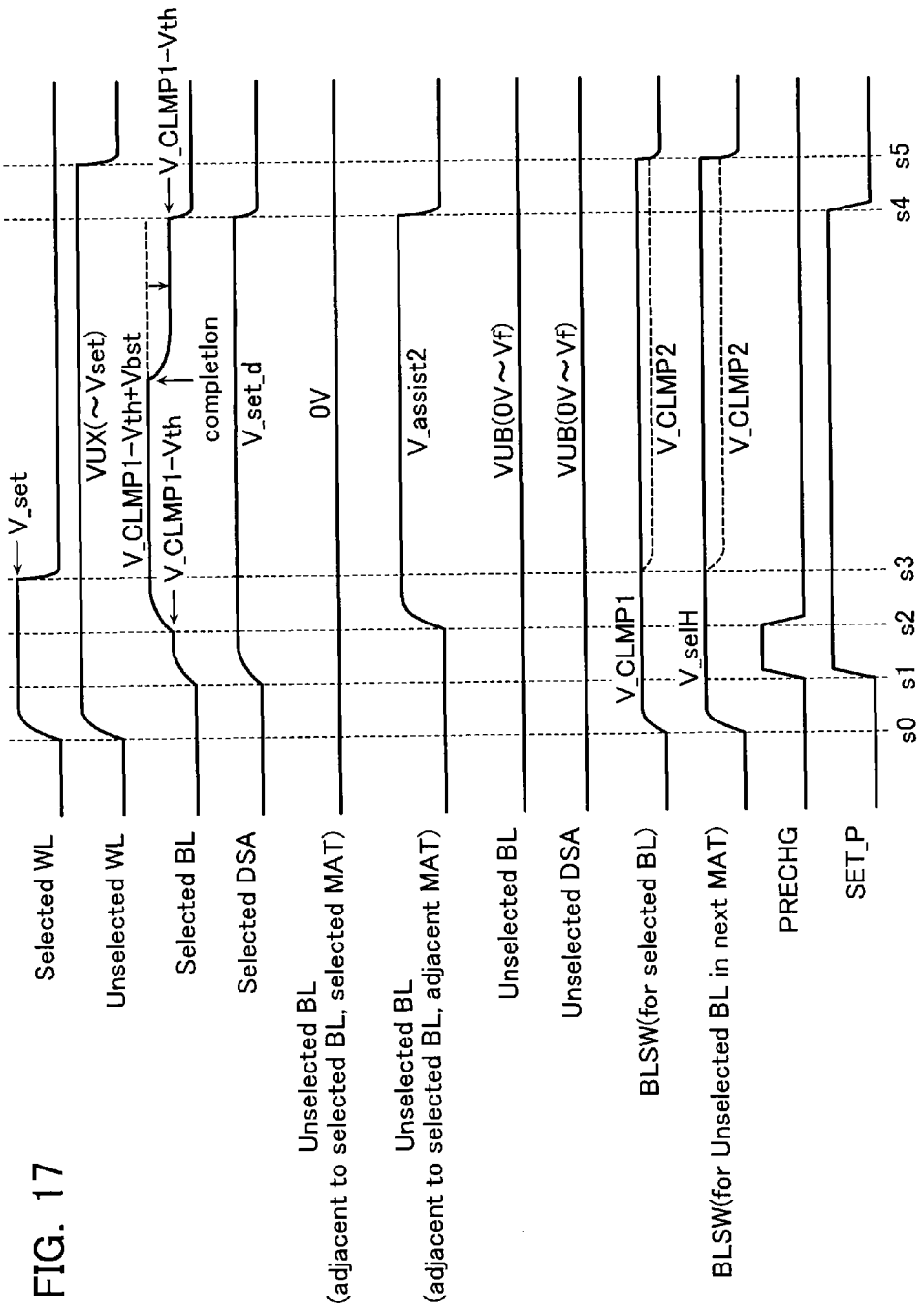
FIG. 17 is a timing chart showing timing waveforms of the set operation in the sixth embodiment.
Figure 18:
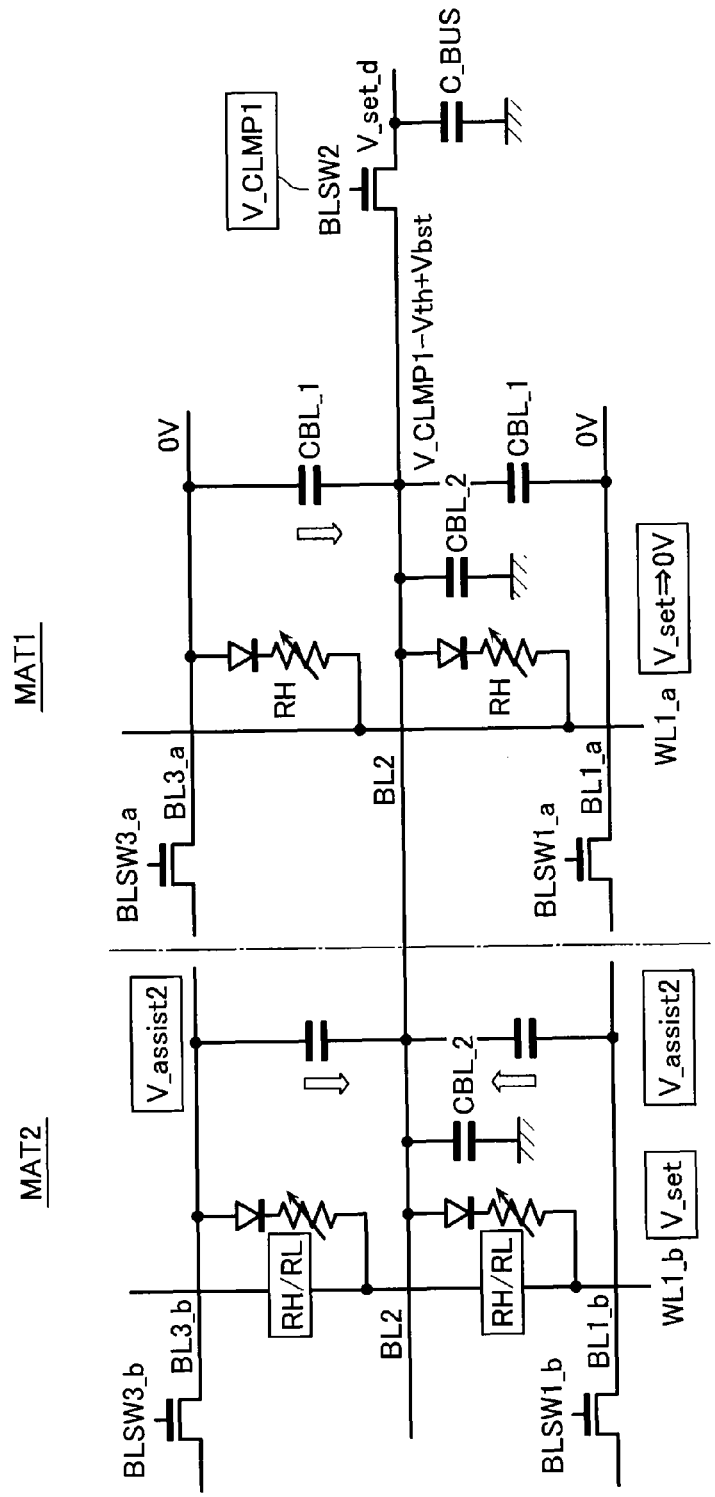
FIG. 18 is a simplified circuit diagram illustrating the set operation in the sixth embodiment.

As shown in FIG. 16, the set voltage can be applied to a plurality of bit lines simultaneously in one memory mat MAT. FIG. 17 shows timing waveforms of a set operation in the present embodiment and FIG. 18 is a simplified circuit diagram illustrating an application method of the voltage. Except for the aforementioned method of applying the voltage V_assist, the present embodiment is the same as the other above embodiments.

Figure 19:
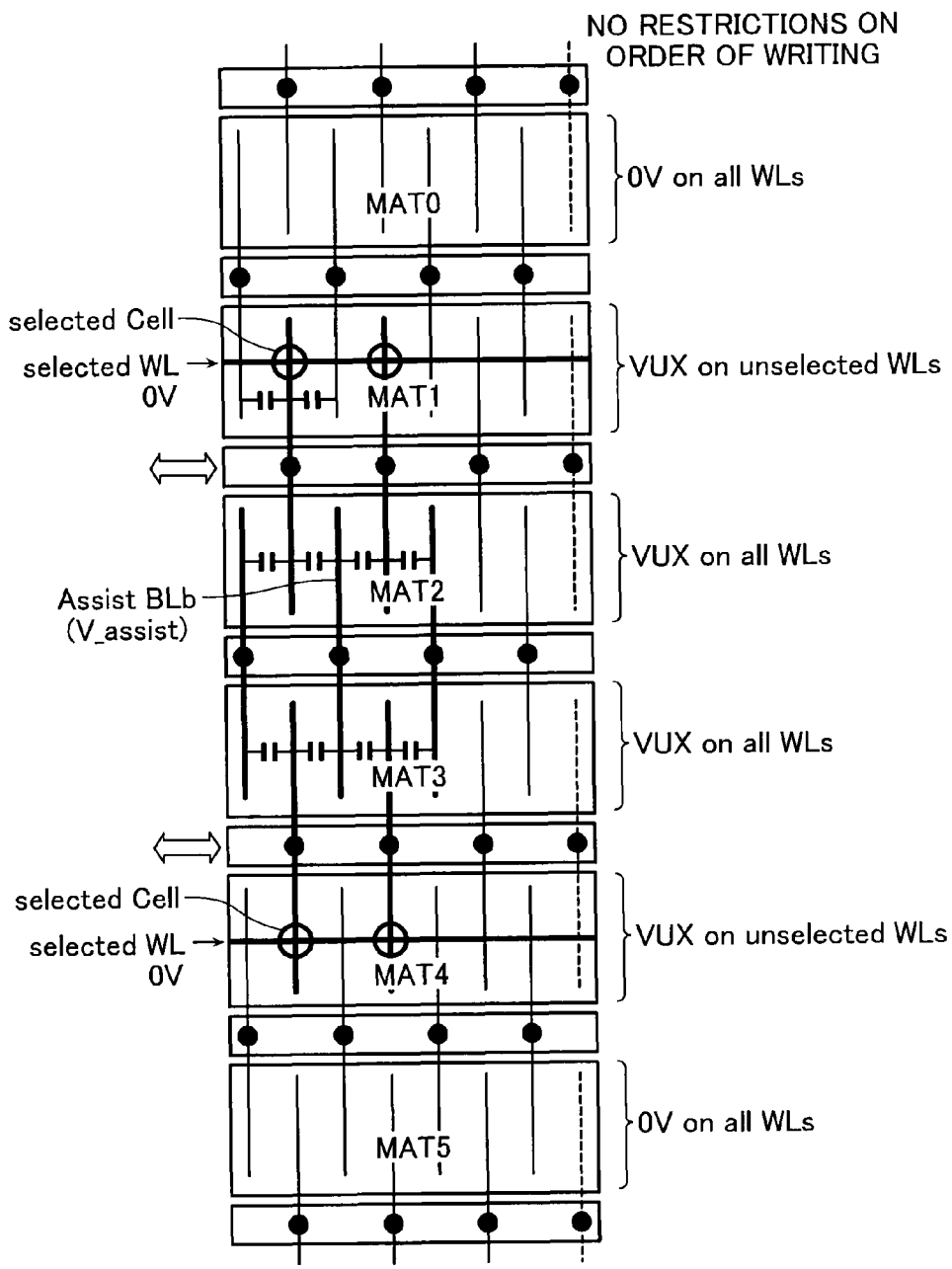
FIG. 19 shows a modification of the sixth embodiment.
Figure 20:
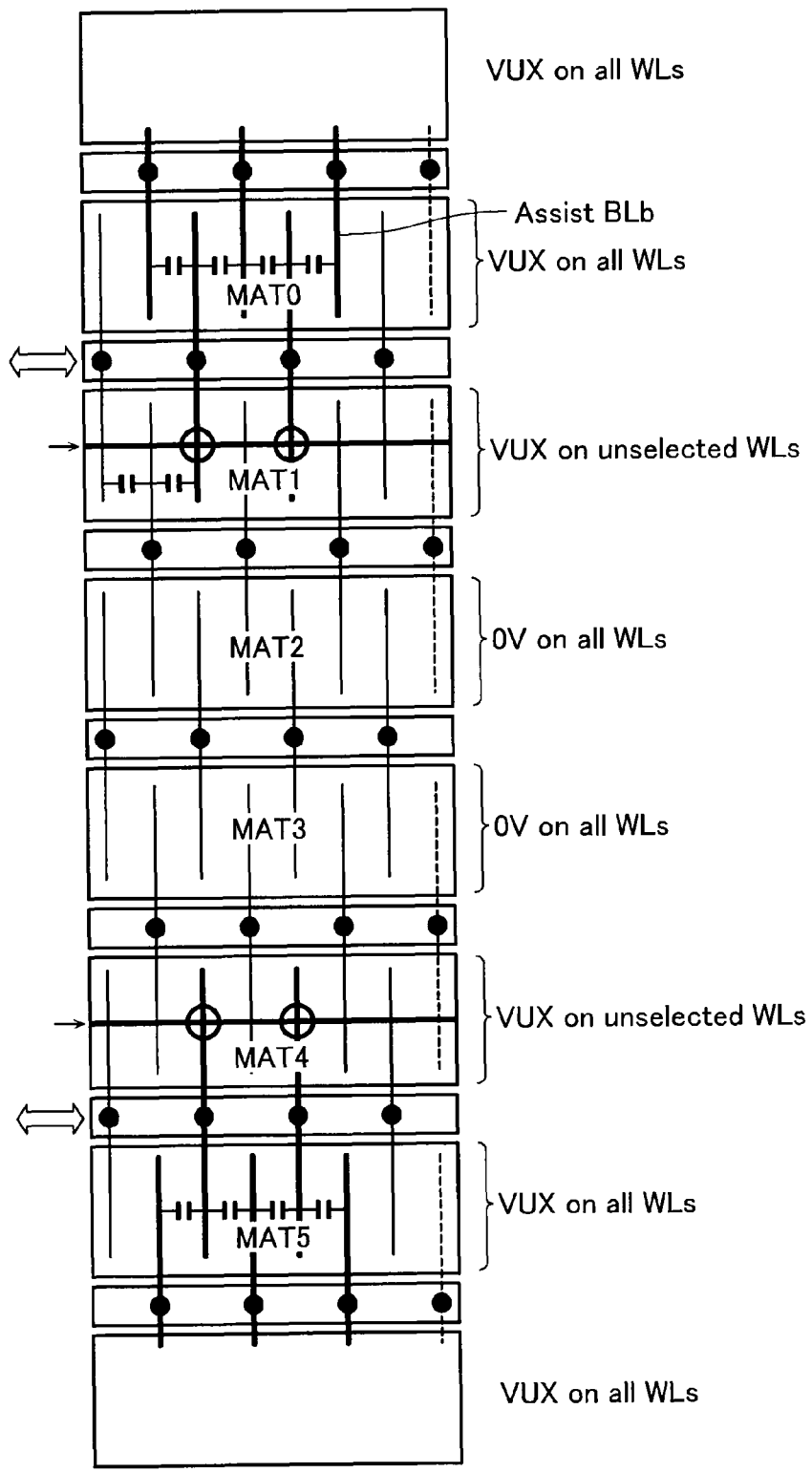
FIG. 20 shows a modification of the sixth embodiment.

Like in the fifth embodiment, two or more memory mats (for example, MAT1 and MAT4) are simultaneously selected from among a plurality of memory mats MAT0 to MAT5, as shown in FIG. 19, charging of the selected bit line BL can be assisted by applying the voltage V_assist to the bit line BLb that does not extend to the selected memory mats MAT1 and MAT4. FIG. 20 shows an example in which the memory mats MAT1 and MAT5 are selected.

Seventh Embodiment

Figure 21:
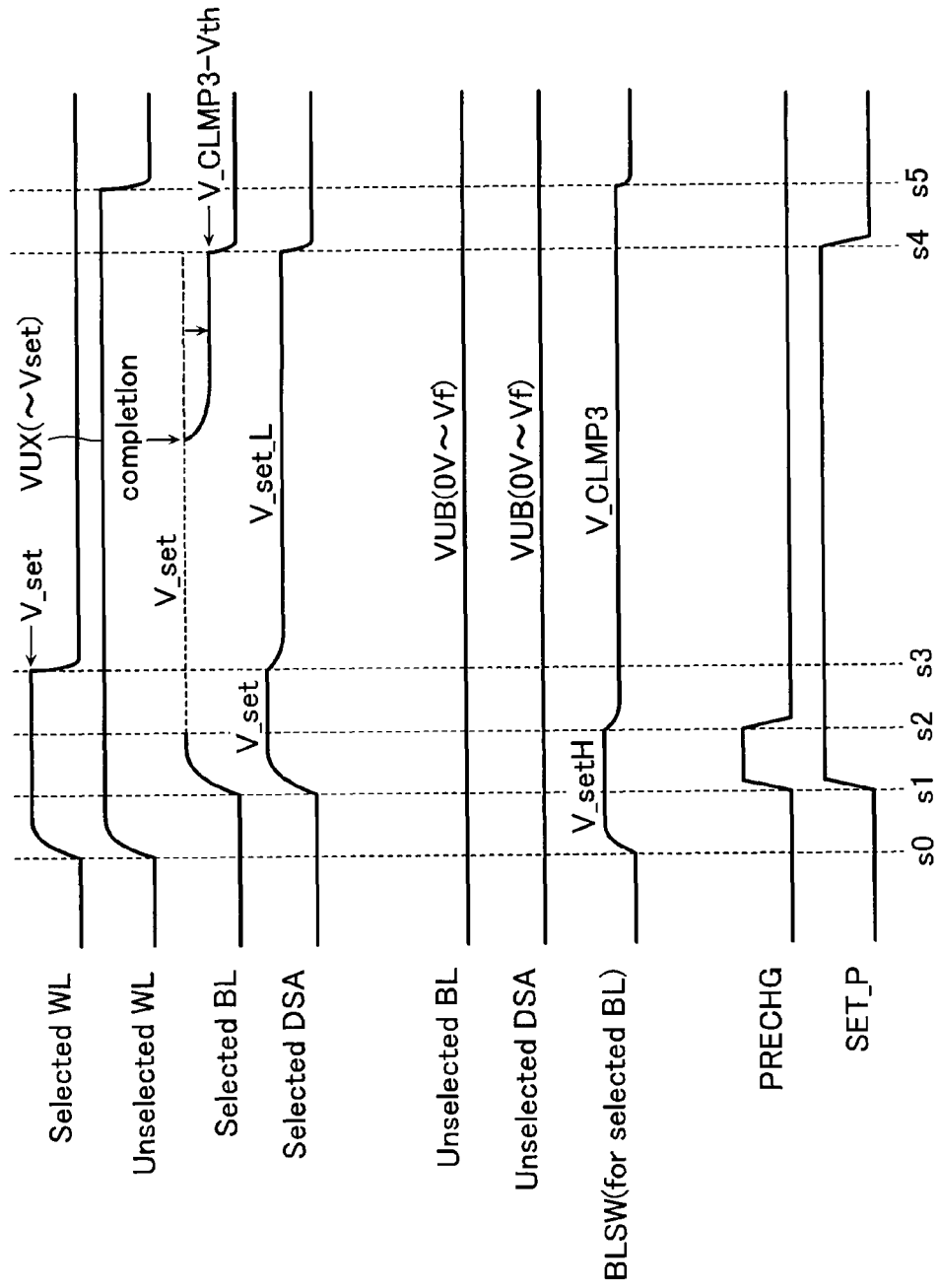
FIG. 21 is a timing chart showing timing waveforms of the set operation in a seventh embodiment.
Figure 22:
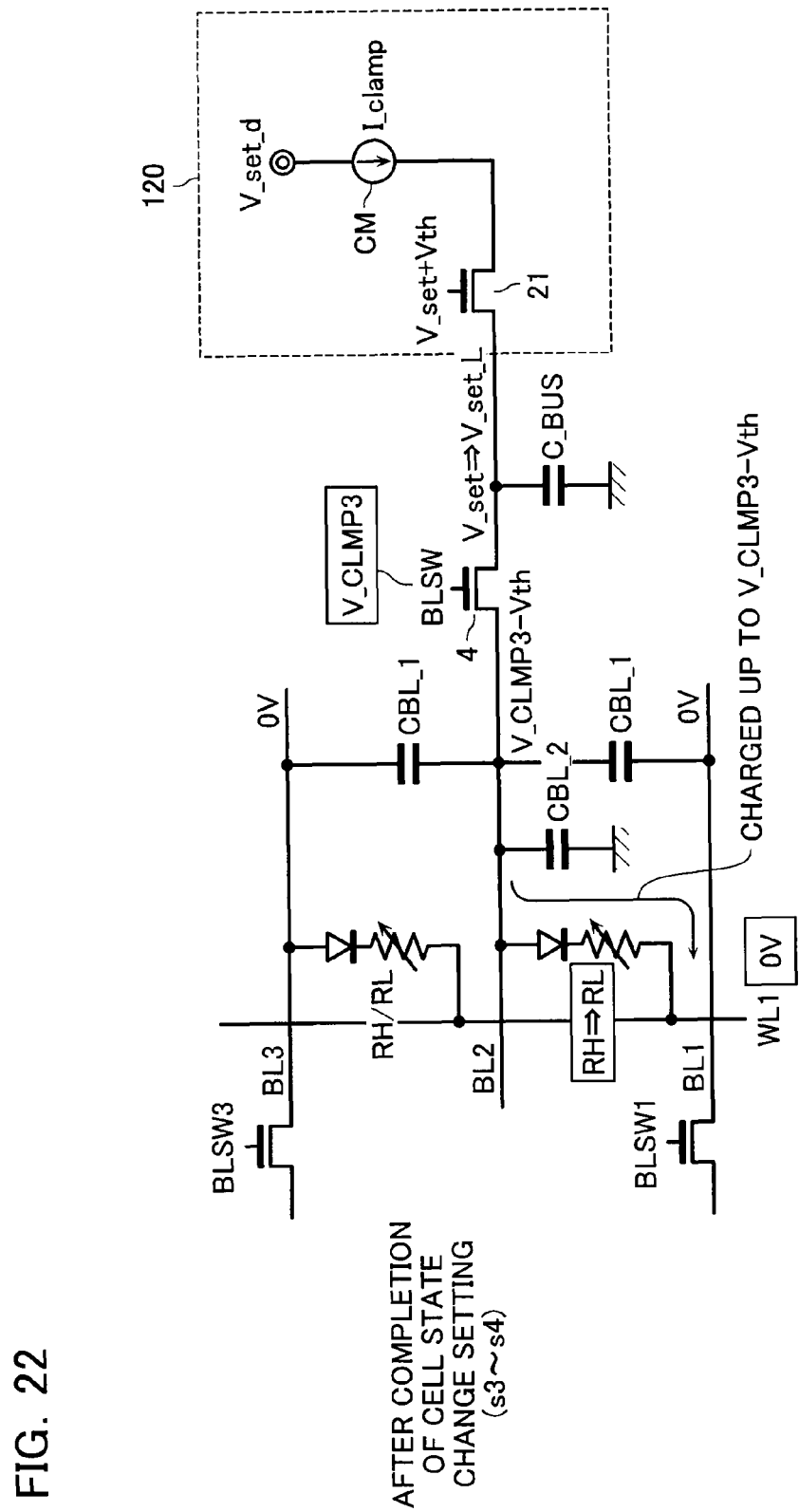
FIG. 22 is a simplified circuit diagram illustrating the set operation in the seventh embodiment.

Next, the seventh embodiment of the present invention will be described with reference to FIGS. 21 and 22. The overall circuit configuration is substantially the same as that of the first embodiment and thus, a description thereof is omitted.

In the aforementioned embodiments, the selected bit line BL is charged up to a predetermined potential and then set in a floating state, subsequently the selected bit line is charged by applying a predetermined voltage to unselected bit lines adjacent to the selected bit line BL. In the present embodiment, by contrast, such adjacent unselected bit lines are not used for charging the selected bit line.

Instead, an operation below is performed in the present embodiment. As shown in FIG. 21, at time s0, the voltage of the signal BLSW supplied to the gate of the bit line selection transistor 4 connected to the selected bit line BL is controlled to a voltage of V_setH. Then, at time s1, the node DSA is charged up to a voltage of V_set, thereby boosting the selected bit line BL up to a voltage of V_set. Subsequently, at time s2, the voltage of the signal BLSW is lowered from a voltage of V_setH to a voltage of V_CLMP3, thereby cutting off the bit line selection transistor 4 to set the selected bit line BL in a floating state.

Subsequently, at time s3, the selected word like WL (selected WL) is lowered to 0 V to apply the set voltage to the memory cell MC, while the potential of the node DSA connected to the selected bit line BL is adjusted to lower it from V_set to V_set_L. The selected bit line BL is in a floating state since time s2. Accordingly, when the memory cell MC changes from the high-resistance state to the low-resistance state, the selected memory cell MC discharges the voltage V_set trapped in the bit line BL, lowering the potential of the selected bit line BL to V_CLMP3-Vth (see FIG. 22). Also in this case, the amount of passing charges through the selected memory cell MC can be reduced by 32% when compared with the conventional technology.

Eighth Embodiment

Next, the eighth embodiment of the present invention will be described with reference to FIGS. 23 and 24.

Figure 23:
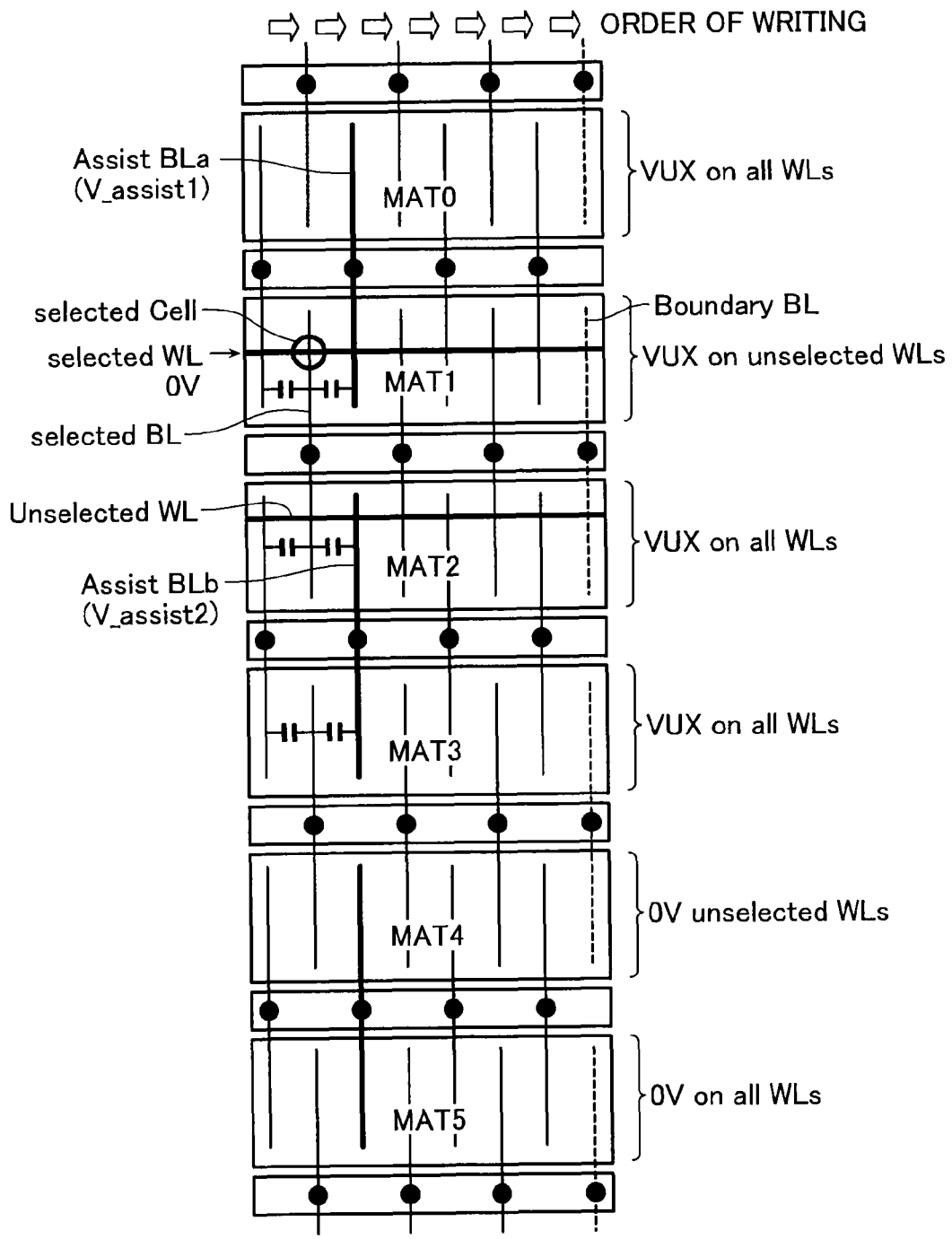
FIG. 23 is a schematic diagram showing the schematic configuration of the memory in an eighth embodiment of the present invention and the operation method thereof.

As shown in FIG. 23, the present embodiment is similar to the fourth to sixth embodiments in that a plurality of memory mats MAT is arranged in the same direction as that in which the bit line BL extends. Also, the present embodiment is similar in that the bit line BL is shared by two adjacent memory mats MAT and bit lines adjacent to each other in one memory mat MAT are pulled out in opposite directions. In addition, the overall circuit configuration is substantially the same as that of the aforementioned embodiments and thus, a description thereof is omitted.

In the present embodiment, however, a way of assisting charging of the selected bit line BL is different from that of the aforementioned embodiments. That is, in the fourth to sixth embodiments, assisting charging of the selected bit line BL is conducted by the following steps:

(1) the selected bit line BL is charged up to a predetermined potential and then set in a floating state; and (2) the voltage V_assist for charging assist is applied to the unselected bit lines (such as BLa and BLb) adjacent to the selected bit line BL.

In the present embodiment, in addition to the above operation, charging of the selected bit line BL is assisted by using a voltage applied to unselected word lines WL crossing the selected bit line BL in the unselected memory mat MATi+1 adjacent to the selected memory mat MATi between operations of (1) and (2). That is, in the present embodiment, in addition to the unselected bit lines BLa and BLb adjacent to the selected bit line BL, unselected word lines WL in the adjacent memory mat MATi+1 adjacent to the selected memory mat MATi are involved in charging assistance of the selected bit line BL.

In FIG. 23, it is assumed that the memory cell MC in the memory mat MAT1 is selected. That is, the selected word line WL (selected WL) crosses the selected memory mat MAT1, as shown in FIG. 23, and the voltage 0 V is applied to the selected word line WL in predetermined timing. The voltage VUX (equivalent to V_set) is applied to other unselected word lines WL in the memory mat MAT1 and the voltage VUX is applied to all word lines WL of the other unselected memory mats MAT0, MAT2, and MAT3 at the end of the steps. These are similar to the fourth embodiment.

In the eighth embodiment, however, the timing of rise of the unselected word lines WL crossing the selected bit line BL in the adjacent memory mat MAT2 adjacent to the selected memory mat MAT1 to the voltage VUX is different from that in the fourth embodiment.

That is, operations (1) to (4) described below are performed in the order shown below to avoid erroneous writing to an unselected memory cell. Unselected word lines WL of the other unselected memory mats MAT0 and MAT3 are at voltage VUX before starting to charge the selected bit line BL.

(1) The voltage of the unselected word line WL crossing the selected bit line BL in the adjacent memory mat MAT2 is switched from 0 V to a voltage VUX1. Here, the voltage VUX1 is a voltage lower than the voltage V_CLMP1-Vth and does not cause a set operation in the memory cell by a potential difference thereof.

(2) The selected bit line BL is set in a floating state after being charged up to the voltage V_CLMP1-Vth. At this point, the voltage VUX is a voltage having a magnitude described above and thus, a forward bias voltage high enough to cause a set operation is not applied to memory cells provided at the point of intersection of unselected word lines WL (voltage VUX1) in the adjacent memory mat MAT2 and the selected bit line BL. Therefore, there is no possibility that data is erroneously written into these memory cells.

(3) The voltage VUX (>VUX1) to assist charging of the selected bit line BL is applied to the unselected word lines WL crossing the selected bit line BL in the adjacent memory mat MAT2.

(4) The voltage V_assist for charging assistance is applied to the unselected bit lines (such as BLa and BLb) adjacent to the selected bit line BL.

The present embodiment is characterized by the operation (3) being performed in timing between the operation (2) and the operation (4). With the operation (3), that is, a boost of the voltage of the unselected word lines WL crossing the selected bit line BL in the unselected adjacent memory mat MAT2 from the voltage VUX1 to the voltage VUX in this timing, the potential of the selected bit line BL rises due to coupling. That is, charging of the selected bit line BL can be assisted.

After charging of the selected bit line BL being assisted using word lines WL in the adjacent memory mat MAT2 in this manner, like the fourth embodiment, the voltage V_assist1 is applied to the unselected bit line BLa adjacent to the selected bit line BL and the voltage V_assist2 is applied to the unselected bit line BLb. Accordingly, the potential of the selected bit line BL can further be raised.

The operation (3) is preferably performed between the operation (2) and the operation (4). If the operation (3) is performed after the operation (4), though dependent on the magnitude of the applied voltage, there is a possibility that a forward voltage is applied to an unselected memory cell positioned at the point of intersection of the word lines WL and the unselected bit line BLb in the adjacent memory mat MAT2, leading to erroneous writing.

In the embodiment described above, like the fourth embodiment, there are restrictions on the order in which the set operation is performed. Therefore, as indicated by outline arrows in the upper part of FIG. 23, for example, there are restrictions on performing the set operation sequentially from a cell on the left side toward cells on the right side. Therefore, the bit line Boundary BL to apply the voltage V_assist is provided in FIG. 23 to perform a similar bit line boost operation on the memory cell on which the set operation is performed lastly. The magnitudes of the voltages V_assist1 and V_assist2 may be similar to those described in the fourth embodiment.

Figure 24:
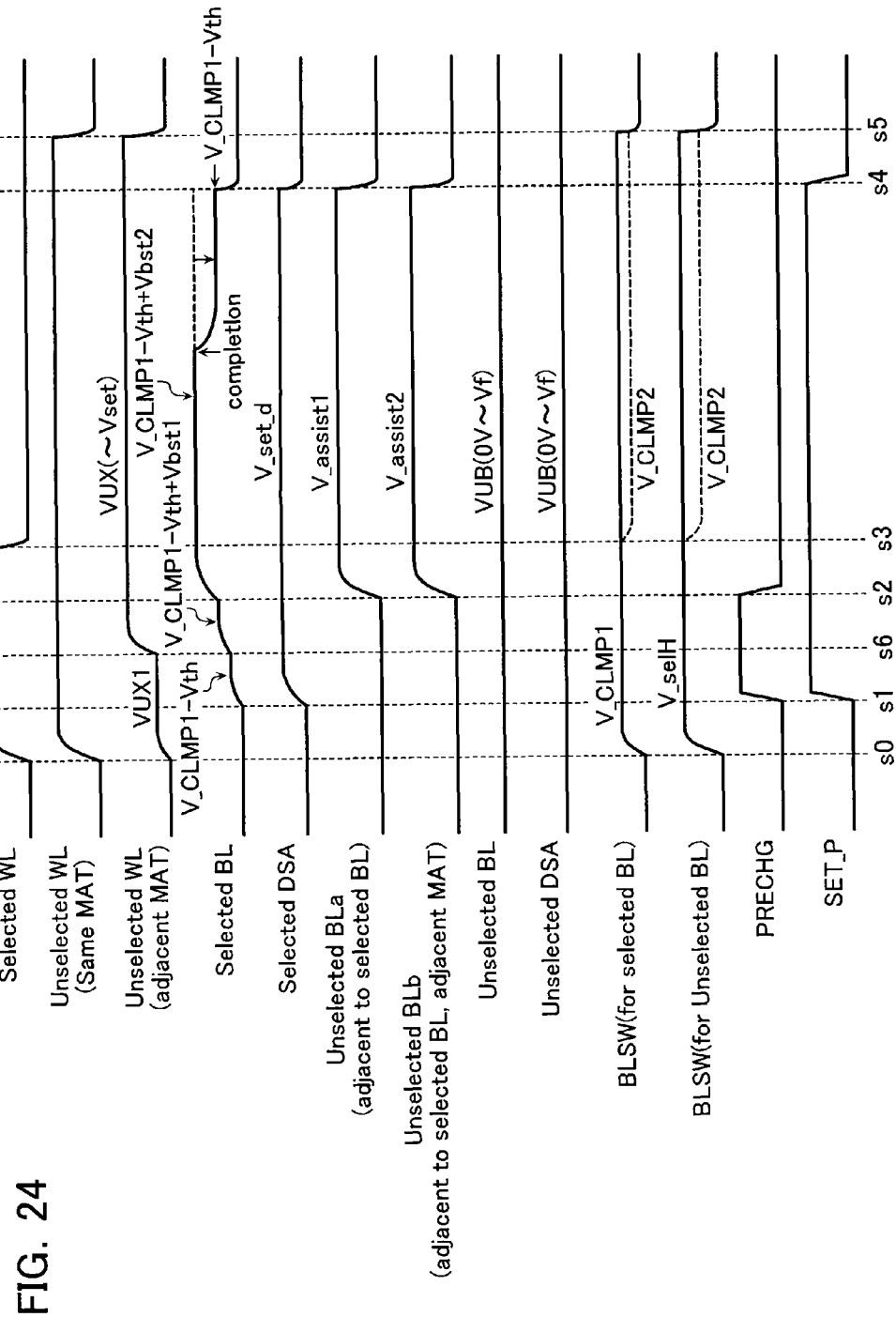
FIG. 24 is a timing chart illustrating the set operation in the memory in the eighth embodiment of the present invention.

FIG. 24 shows timing waveforms when a set operation is performed by applying the voltage VUX to unselected word lines WL in the adjacent memory mat MAT2 and the different voltages V_assist1 and V_assist2 to the adjacent unselected bit lines BLa and BLb. Except for the timing of the unselected word lines WL of the adjacent memory mat MAT2 (Unselected WL, adjacent MAT), the present embodiment is the same as the fourth embodiment and thus, a duplicate description is omitted.

First, at time s0, the voltage of the unselected word lines WL of the adjacent memory mat MAT2 (Unselected WL, adjacent MAT) is switched from 0 V to the above voltage VUX1.

Then, the voltage of the selected bit line BL is boosted to the voltage V_CLMP1-Vth after starting to rise at time s1 and the selected bit line BL is set in a floating state, the unselected word lines WL of the adjacent memory mat MAT2 are raised from the voltage VUX1 to the voltage VUX at time s6 between time s1 and time s2.

In this respect, the present embodiment is different from the fourth embodiment in which all unselected word lines WL including the adjacent memory mat MAT2 are raised to the voltage VUX at time s0 (see FIG. 13). With the unselected word lines WL in the adjacent memory mat MAT2 being raised to the voltage VUX at time s6, charging of the selected bit line BL can be assisted.

That is, with the word line WL in the adjacent memory mat MAT2 being raised to the voltage VUX at time s6, the voltage of the selected bit line BL rises from the voltage V_CLMP1-Vth to the voltage V_CLMP1-Vth+Vbst1. Then, at time s2, like the fourth embodiment, the voltages V_assist1 and V_assist2 are applied to the adjacent bit lines BLa and BLb adjacent to the selected bit line BL. Accordingly, the voltage of the selected bit line BL is further raised to V_CLMP1-Vth+Vbst2. Then, a write operation is performed in the same way as in the above embodiments.

In the eighth embodiment, unselected word lines crossing the selected bit line BL in memory mats adjacent to the selected memory mat are selected as word lines to assist in charging the selected bit line BL, but the present invention is not limited to this and, if there is no possibility of erroneously writing data or erasing data, unselected word lines crossing the selected bit line in the same memory mat can be controlled in the similar manner. Also, the present invention is not limited to, like the present embodiment, a memory cell array divided into a plurality of memory mats.

Ninth Embodiment

Figure 25:
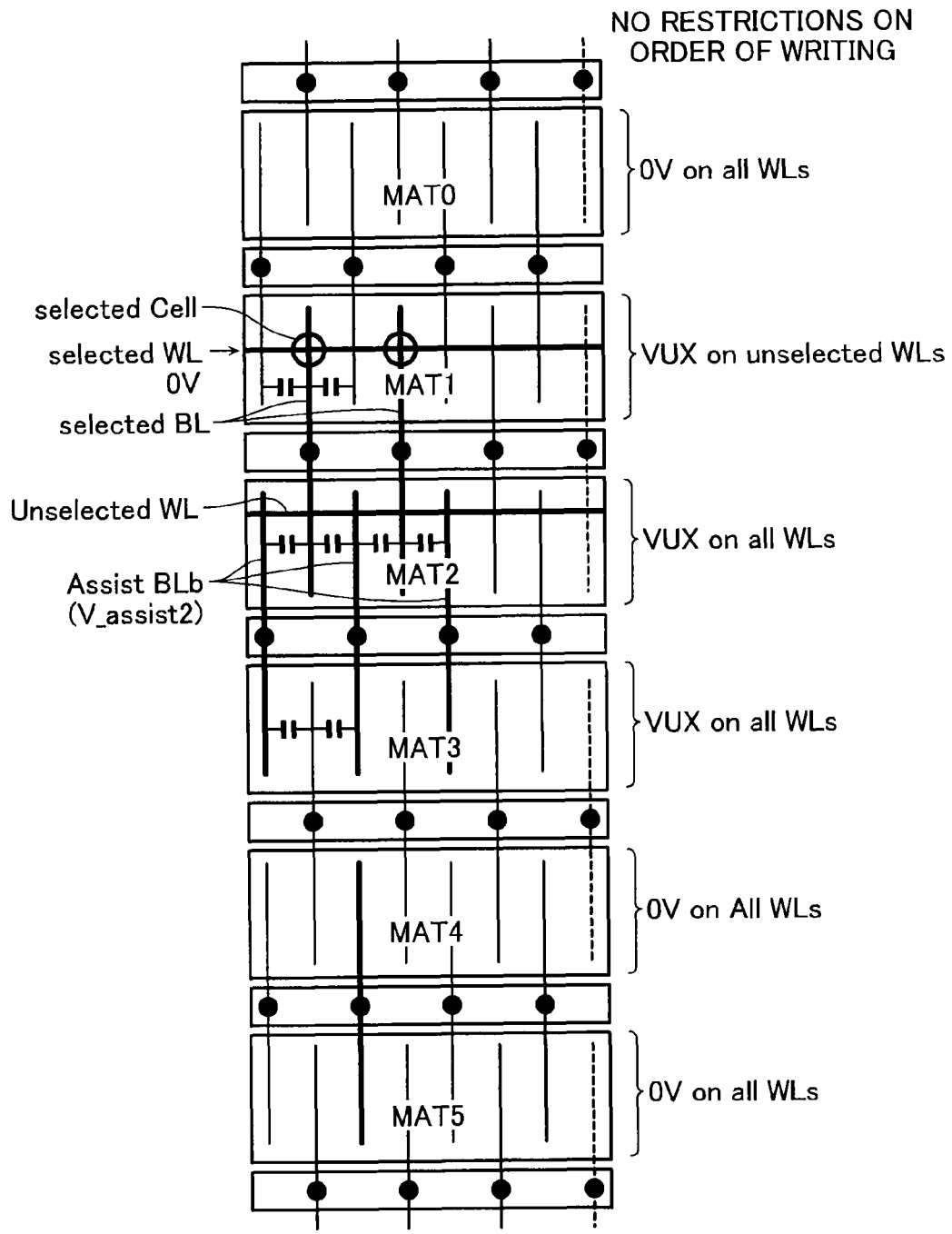
FIG. 25 is a schematic diagram showing the schematic configuration of the memory in a ninth embodiment of the present invention and the operation method thereof.

Next, the ninth embodiment of the present invention will be described with reference to FIGS. 25 and 26. As shown in FIG. 25, the present embodiment is similar to the fourth to sixth and the eighth embodiments in that a plurality of memory mats MAT is arranged in the same direction as that in which the bit line BL extends. The overall circuit configuration is substantially the same as that of the fourth to sixth and the eighth embodiments and thus, a description thereof is omitted.

In the present embodiment, charging is assisted not only by unselected bit lines adjacent to the selected bit line BL, but also by unselected word lines WL in adjacent mats MAT. In this respect, the present embodiment is similar to the eighth embodiment.

However, in the present embodiment, like the sixth embodiment, charging of the selected bit line BL is assisted by applying the voltage V_assist to unselected bit lines BLb on both sides of the selected bit line BL in the adjacent unselected memory mat MAT2 in order to boost the voltage of the selected bit line BL in the selected memory mat MAT1. Since the unselected bit lines BLb do not extend to the selected memory mat MAT1, restrictions on the order in which the set operation in one memory mat is performed can be eliminated.

Figure 26:
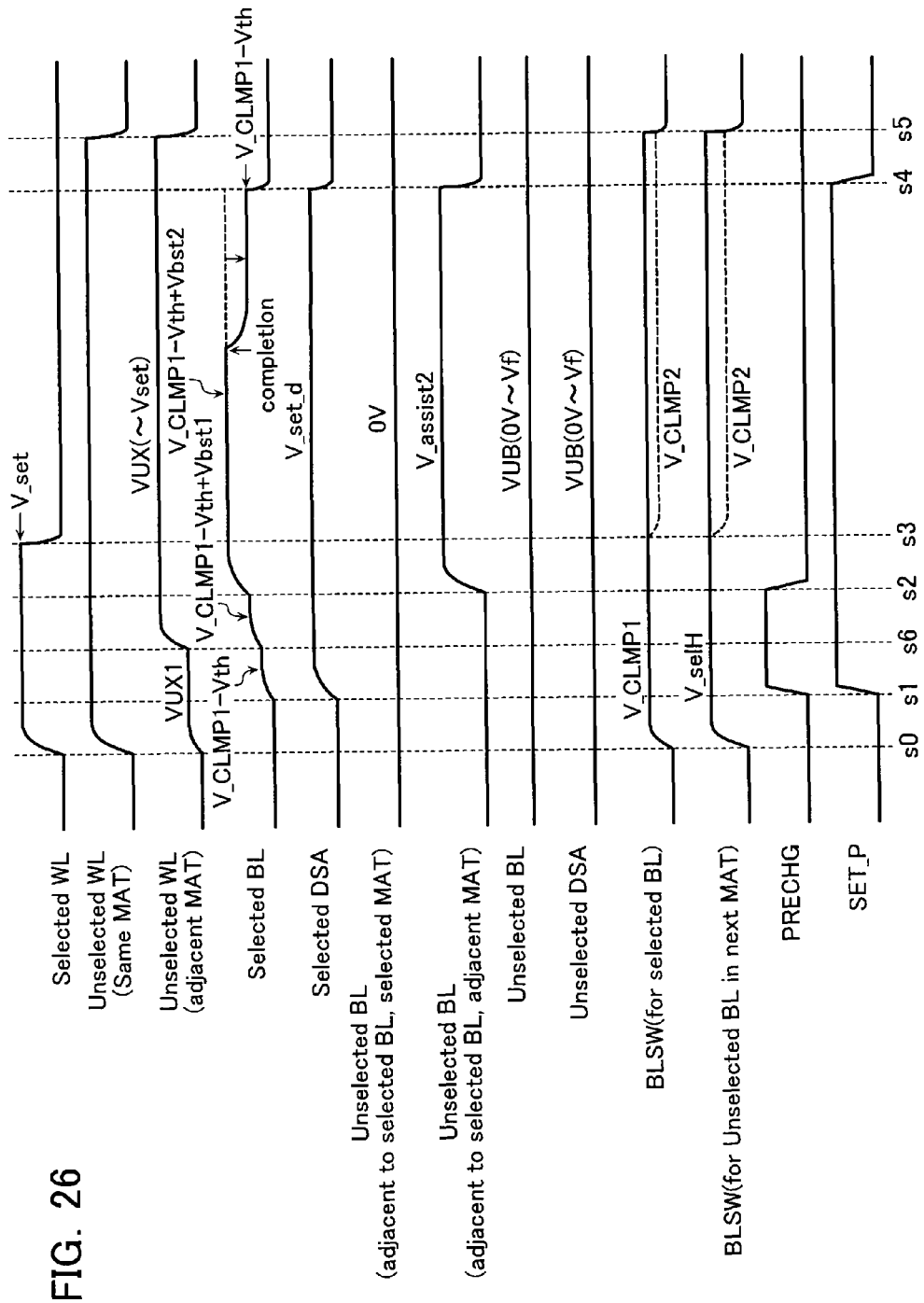
FIG. 26 is a timing chart illustrating the set operation in the memory in the ninth embodiment of the present invention.

FIG. 26 shows timing waveforms when a set operation in the ninth embodiment is performed. Like the eighth embodiment, the word line WL in the adjacent memory mat MAT2 rises to the voltage VUX at time s6, thereby the voltage of the selected bit line BL being raised from the voltage V_CLMP1-Vth to the voltage V_CLMP1-Vth+Vbst1. Otherwise, the present embodiment is the same as the aforementioned embodiments and thus, a duplicate description is omitted.

In the foregoing, embodiments of the present invention have been described, but the present invention is not limited to these embodiments and various modifications, additions, replacements, or erasure can be made without deviating from the spirit of the present invention. In the above embodiments, for example, operations of a bit line selection transistor and control of the bit line voltage are taken as examples to describe the embodiments, but it is needless to say that similar control of the word line can also be executed.

What is claimed is:

1. A semiconductor storage apparatus, comprising:
a memory cell array including memory cells each having a rectifying element and a variable resistive element connected in series, the memory cells being arranged in crossing portions of a plurality of first wires and a plurality of second wires; and
a control circuit configured to control charging to the first wire,
the control circuit being configured to sequentially perform
a first step to charge the first wire connected to a selected memory cell up to a first potential and then set the first wire in floating state, and then
a second step to charge another first wire adjacent to the first wire connected to the selected memory cell up to a second potential, thereby causing the potential of the first wire connected to the selected memory cell to rise up to a third potential by coupling,
data program of the selected memory cell being performed by the third potential.

2. The semiconductor storage apparatus according to claim 1, further comprising a selection transistor connected to the first wire and having a gate supplied with a selection signal, wherein
the selection transistor is configured to turn off, when the first wire is charged up to a potential controlled by a magnitude of the selection signal, to maintain the first wire in a floating state.

3. The semiconductor storage apparatus according to claim 2, wherein
after another first wire adjacent to the first wire connected to the selected memory cell is charged to the second potential, the control circuit performs an operation to lower a gate signal of the selection transistor connected to the first wire connected to the selected memory cell.

4. The semiconductor storage apparatus according to claim 3, wherein
after another first wire adjacent to the first wire connected to the selected memory cell is charged to the second potential, the control circuit performs the operation to lower the gate signal of the selection transistor connected to another first wire adjacent to the first wire connected to the selected memory cell.

5. The semiconductor storage apparatus according to claim 1, wherein
another first wire which is adjacent to the first wire connected to the selected memory cell and is charged to the second potential is not connected to a memory cell for which set operation to change from a high-resistance state to a low-resistance state is completed.

6. The semiconductor storage apparatus according to claim 1, wherein
the memory cell array includes a plurality of memory mats arranged along the same direction as that of the first wire,
the first wire is shared by two of the memory cell mats adjacent to each other, and
the first wires adjacent to each other in one of the memory cell mats are pulled out therefrom in opposite directions.

7. The semiconductor storage apparatus according to claim 6, wherein
when the first wire connected to the selected memory cell is shared by the (n+1)-th (n is a natural number) and (n+2)-th memory mats,
the control circuit charges the first wire shared by the n-th and (n+1)-th memory mats up to the second potential and also charges the first wire shared by the (n+2)-th and (n+3)-th memory mats up to a potential that is different from the second potential.

8. The semiconductor storage apparatus according to claim 6, wherein the first wire charged up to the second potential does not extend to a memory mat including the selected memory cell, and is adjacent to the first wire connected to the selected memory cell in a memory mat adjacent to the memory mat including the selected memory cell.

9. The semiconductor storage apparatus according to claim 8, wherein the first wires charged up to the second potential are adjacent to the first wire connected to the selected memory cell on both sides thereof.

10. The semiconductor storage apparatus according to claim 1, wherein
the control circuit is configured to perform a third step that charges the second wire crossing the first wire up to a fourth potential between the first step and the second step, thereby raising by coupling the potential of the first wire connected to the selected memory cell up to a fifth potential lower than the third potential.

11. The semiconductor storage apparatus according to claim 10, wherein
the control circuit is configured to perform a fourth step that charges the second wire crossing the first wire up to a sixth potential before the first step,
the sixth potential is lower than the fourth potential.

12. A semiconductor storage apparatus comprising:
a memory cell array including a memory cells each having rectifying element and a variable resistive element connected in series, the memory cells being arranged in crossing portions of a plurality of first wires and a plurality of second wires;
a selection transistor connected to the first wire and having a gate supplied with a selection signal; and
a control circuit configured to control charging to the first wire by controlling the selection transistor,
the control circuit being configured to control the selection signal to be supplied to the selection transistor that is connected to the first wire connected to the selected memory cell to charge the first wire to a first potential and then set the first wire in a floating state by lowering a magnitude of the selection signal.

13. A data programming method of a semiconductor storage apparatus having a memory cell array including memory cells each having a rectifying element and a variable resistive element connected in series, the memory cells being arranged in crossing portions of a plurality of first wires and a plurality of second wires, the method comprising:
after charging the first wire connected to the selected memory cell up to a first potential, setting the first wire connected to the selected memory cell in a floating state;
charging another first wire adjacent to the first wire connected to the selected memory cell up to a second potential, thereby causing the potential of the first wire connected to the selected memory cell to rise up to a third potential by coupling; and
performing data program of the selected memory cell by the third potential.

14. The data program method of a semiconductor storage apparatus according to claim 13, wherein
the semiconductor storage apparatus further comprises a selection transistor connected to the first wire and having a gate supplied with a selection signal and the selection transistor is configured to turn off, when the first wire is charged up to a potential controlled by a magnitude of the selection signal, to maintain the first wire in a floating state.

15. The data program method of a semiconductor storage apparatus according to claim 14, wherein
after another first wire adjacent to the first wire connected to the selected memory cell is charged to the second potential, an operation to lower a gate signal of the selection transistor connected to the first wire connected to the selected memory cell is performed.

16. The data program method of a semiconductor storage apparatus according to claim 13, wherein
another first wire which is adjacent to the first wire connected to the selected memory cell and is charged to the second potential is not connected to a memory cell for which set operation to change from a high-resistance state to a low-resistance state is completed.

17. The data program method of a semiconductor storage apparatus according to claim 13, wherein
the memory cell array includes a plurality of memory mats arranged along the same direction as that of the first wire,
the first wire is shared by two of the memory cell mats adjacent to each other, and
the first wires adjacent to each other in one of the memory cell mats are pulled out in opposite directions.

18. The data program method of a semiconductor storage apparatus according to claim 17, wherein
when the first wire connected to the selected memory cell is shared by the (n+1)-th (n is a natural number) and (n+2)-th memory mats,
the first wire shared by the n-th and (n+1)-th memory mats is charged up to the second potential and also the first wire shared by the (n+2)-th and (n+3)-th memory mats is charged up to a potential that is different from the second potential.

19. The data program method of a semiconductor storage apparatus according to claim 17, wherein
the first wire charged up to the second potential does not extend to a memory mat including the selected memory cell, and is adjacent to the first wire connected to the selected memory cell in a memory mat adjacent to the memory mat including the selected memory cell.

20. The data program method of a semiconductor storage apparatus according to claim 13, wherein
the second wire crossing first wire is charged up to a fourth potential after the first wire is set in a floating state and before the another first wire adjacent to the first wire connected to the selected memory cell is charged up to the second potential, thereby raising by coupling the potential of the first wire connected to the selected memory cell up to a fifth potential lower than the third potential.

* * * * *